(12) United States Patent
Hua et al.

(10) Patent No.: US 10,937,796 B2
(45) Date of Patent: Mar. 2, 2021

(54) METHODS FOR FORMING MULTI-DIVISION STAIRCASE STRUCTURE OF THREE-DIMENSIONAL MEMORY DEVICE

(71) Applicant: YANGTZE MEMORY TECHNOLOGIES CO., LTD., Wuhan (CN)

(72) Inventors: Wenyu Hua, Wuhan (CN); Zhong Zhang, Wuhan (CN); Zhiliang Xia, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 0 days.

(21) Appl. No.: 16/898,288

(22) Filed: Jun. 10, 2020

(65) Prior Publication Data
US 2020/0303392 A1 Sep. 24, 2020

Related U.S. Application Data

(60) Division of application No. 16/195,852, filed on Nov. 20, 2018, now Pat. No. 10,714,492, which is a
(Continued)

(51) Int. Cl.
*H01L 27/11556* (2017.01)
*H01L 27/11524* (2017.01)
(Continued)

(52) U.S. Cl.
CPC .... *H01L 27/11556* (2013.01); *H01L 27/1157* (2013.01); *H01L 27/11524* (2013.01);
(Continued)

(58) Field of Classification Search
CPC ......... H01L 27/11556; H01L 27/11524; H01L 27/11529; H01L 27/1157; H01L 27/11573;
(Continued)

(56) References Cited

U.S. PATENT DOCUMENTS

2012/0306089 A1  12/2012  Freeman et al.
2014/0057429 A1   2/2014  Oh et al.
(Continued)

FOREIGN PATENT DOCUMENTS

CN   101042999 A   9/2007
CN   103928395 A   7/2014
(Continued)

OTHER PUBLICATIONS

International Search Report issued in corresponding International Application No. PCT/CN2018/110800, dated Jul. 8, 2019, 4 pages.
(Continued)

*Primary Examiner* — Shaun M Campbell
(74) *Attorney, Agent, or Firm* — Bayes PLLC

(57) ABSTRACT

Embodiments of methods for forming a staircase structure of a three-dimensional (3D) memory device are disclosed. In an example, a first plurality of stairs of the staircase structure are formed based on a first photoresist mask. Each of the first plurality of stairs includes a number of divisions at different depths. After forming the first plurality of stairs, a second plurality of stairs of the staircase structure are formed based on a second photoresist mask. Each of the second plurality of stairs includes the number of divisions. The staircase structure tilts downward and away from a memory array structure of the 3D memory device from the first plurality of stairs to the second plurality of stairs.

15 Claims, 19 Drawing Sheets

Related U.S. Application Data continuation of application No. PCT/CN2018/110800, filed on Oct. 18, 2018.

(51) Int. Cl.
*H01L 27/11529* (2017.01)
*H01L 27/1157* (2017.01)
*H01L 27/11573* (2017.01)
*H01L 27/11582* (2017.01)

(52) U.S. Cl.
CPC .. *H01L 27/11529* (2013.01); *H01L 27/11573* (2013.01); *H01L 27/11582* (2013.01)

(58) Field of Classification Search
CPC ........... H01L 27/11582; H01L 23/5226; H01L 23/76816; H01L 23/5283
See application file for complete search history.

(56) References Cited

U.S. PATENT DOCUMENTS

| | | | | |
|---|---|---|---|---|
| 2015/0228623 | A1* | 8/2015 | Oh | .............. H01L 27/11582 257/4 |
| 2016/0322376 | A1* | 11/2016 | Lee | .............. H01L 27/11582 |
| 2017/0170057 | A1 | 6/2017 | Huo | |
| 2017/0207220 | A1 | 6/2017 | Yun et al. | |
| 2017/0200676 | A1* | 7/2017 | Jeong | .............. H01L 21/76816 |
| 2018/0090510 | A1 | 3/2018 | Kato et al. | |
| 2019/0214404 | A1 | 7/2019 | Ahn et al. | |
| 2020/0051996 | A1 | 2/2020 | Lee | |

FOREIGN PATENT DOCUMENTS

| | | |
|---|---|---|
| CN | 106409769 A | 2/2017 |
| CN | 107039457 A | 8/2017 |
| CN | 107431063 A | 12/2017 |
| CN | 108550574 A | 9/2018 |
| CN | 108711572 A | 10/2018 |
| TW | 200903738 A | 1/2009 |

OTHER PUBLICATIONS

Written Opinion of the International Searching Authority issued in corresponding International Application No. PCT/CN2018/110800, dated Jul. 8, 2019, 5 pages.

\* cited by examiner

METHODS FOR FORMING MULTI-DIVISION STAIRCASE STRUCTURE OF THREE-DIMENSIONAL MEMORY DEVICE

CROSS-REFERENCE TO RELATED APPLICATION

This application is divisional of U.S. application Ser. No. 16/195,852, filed on Nov. 20, 2018, entitled "METHODS FOR FORMING MULTI-DIVISION STAIRCASE STRUCTURE OF THREE-DIMENSIONAL MEMORY DEVICE," which is continuation of International Application No. PCT/CN2018/110800, filed on Oct. 18, 2018, entitled "METHODS FOR FORMING MULTI-DIVISION STAIRCASE STRUCTURE OF THREE-DIMENSIONAL MEMORY DEVICE," both of which are hereby incorporated by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of fabrication methods of multi-division staircase structures of 3D memory devices are disclosed herein.

In one example, a method for forming a staircase structure of a 3D memory device is disclosed. A stack structure including interleaved first material layers and second material layers is formed. A first photoresist mask is patterned in a first region of the stack structure. A first plurality of divisions are formed at different depths in a first direction in the first region of the stack structure by a plurality cycles of trimming the first photoresist mask in the first direction and etching a part of the stack structure uncovered by the first photoresist mask. A plurality of first stairs of the first plurality of divisions are formed in a second direction perpendicular to the first direction in the first region of the stack structure. A second photoresist mask is patterned in a second region of the stack structure after forming the plurality of first stairs. A second plurality of divisions are formed at different depths in the first direction in the second region of the stack structure by a plurality cycles of trimming the second photoresist mask in the first direction and etching another part of the stack structure uncovered by the second photoresist mask. A plurality of second stairs of the second plurality of divisions are formed in the second direction in the second region of the stack structure.

In another example, a method for forming a staircase structure of a 3D memory device is disclosed. A first plurality of stairs of the staircase structure are formed based on a first photoresist mask. Each of the first plurality of stairs includes a number of divisions at different depths. After forming the first plurality of stairs, a second plurality of stairs of the staircase structure are formed based on a second photoresist mask. Each of the second plurality of stairs includes the number of divisions. The staircase structure tilts downward and away from a memory array structure of the 3D memory device from the first plurality of stairs to the second plurality of stairs.

In still another example, a 3D memory device includes a memory array structure and a staircase structure. The staircase structure includes a first plurality of stairs, a second plurality of stairs, and at least one intermediate stair. Each of the first plurality of stairs includes a first number of divisions at different depths in a first direction. The second plurality of stairs are farther away from the memory array structure than the first plurality of stairs in a second direction perpendicular to the first direction. Each of the second plurality of stairs includes the first number of the divisions. The at least one intermediate stair is between the first plurality of stairs and the second plurality of stairs in the second direction. Each of the at least one intermediate stair includes a second number of divisions in the first direction that is fewer than the first number.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
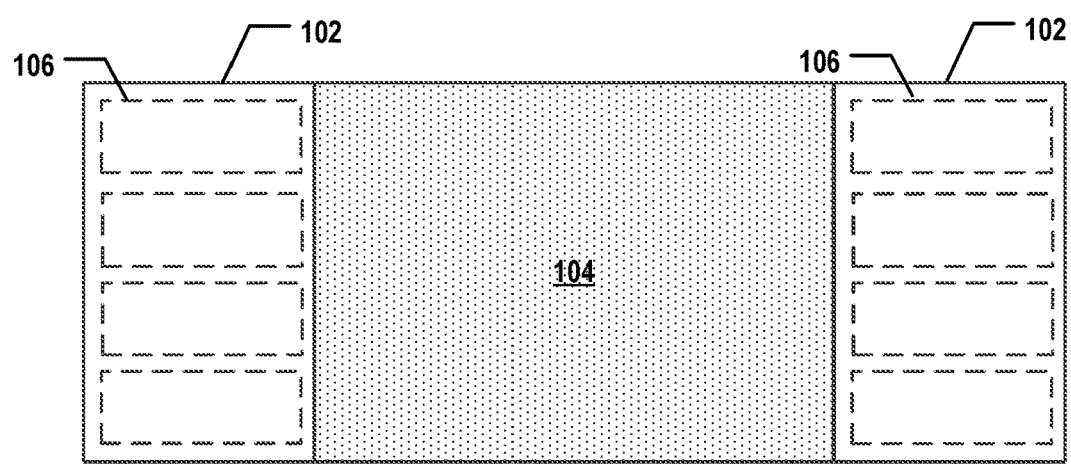
FIG. 1 illustrates a schematic diagram of an exemplary 3D memory device having staircase structures, according to some embodiments of the present disclosure.
Figure 1:

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, memory cells for storing data are vertically stacked through a stacked storage structure (e.g., a memory stack). 3D memory devices usually include staircase structures formed on one or more sides of the stacked storage structure for purposes such as word line fan-out. As the demand for higher storage capacity continues to increase, the number of vertical levels of the stacked storage structure also increases. Multi-division staircase structures have been used in some 3D NAND memory devices in which each stair (level) of the staircase structure can have multiple divisions for fan-out multiple word lines using the same stair, thereby reducing the interconnect layout complexity and increasing the utilization of the staircase structure.

During the fabrication of the multi-division staircase structures, in particular the etching process, side wall issue, e.g., inconsistent width between the top and bottom stairs, may occur. The issue can be compensated to a certain degree by staircase dividing pattern (SDP) mask design. However, due to the problem associated with the etch rate within wafer uniformity, bias exists between adjacent bottom staircases, which can cause yield loss when it exceeds a certain threshold range. The problem of the bias can become more serious when the level of stacked storage structure keeps increasing, e.g., greater than 64 levels, as the bias can be accumulated when using a single SDP mask for fabricating the staircase structure.

Various embodiments in accordance with the present disclosure provide methods for forming multi-division staircase structures of 3D memory devices using multiple SDP masks. By replacing the conventional single SDP mask with multiple SDP masks when forming the staircase structure, the total bias can be distributed among multiple SDP masks, such that the impact of the bias to each individual SDP mask and the staircase structure formed thereby can be reduced, e.g., not beyond the threshold range that can cause yield loss, thereby increasing the yield of the 3D memory devices.

FIG. 1 illustrates a schematic diagram of an exemplary 3D memory device 100 having staircase structures 102, according to some embodiments of the present disclosure. 3D memory device 100 can include a memory array structure 104 in the center and a plurality of staircase structures 102 at the outer sides. In some embodiments, 3D memory device 100 is a NAND Flash memory device in which memory cells are provided in the form of an array of NAND memory strings (not shown) in memory array structure 104. Memory array structure 104 can include any other suitable components including, but not limited to, gate line slits (GLSs), through array contacts (TACs), array common sources (ACSs), etc.

It is noted that x and y axes are included in FIG. 1 to illustrate two orthogonal directions in the wafer plane. In some embodiments, the x-direction is the word line direction of 3D memory device 100, and the y-direction is the bit line direction of 3D memory device 100. Although FIG. 1 shows two staircase structures 102 at the outer sides in the x-direction, it is understood that additional staircase structures can be formed at the outer sides in the y-direction as well. Staircase structure 102 can be either a functional staircase structure used for landing interconnects (e.g., word line via contacts) and/or dummy channel holes or a dummy staircase structure used for balancing load in etching or chemical mechanical polishing (CMP) processes during fabrication.

As shown in FIG. 1, each staircase structure 102 includes a plurality of SDP areas 106 separated from one another in the y-direction. As described below in detail, staircase structure 102 can be a multi-division staircase structure including a plurality of divisions at different depths in the y-direction in each stair of staircase structure 102. The multiple divisions can be disposed in multiple SDP areas 106. In some embodiments, the divisions are formed only in SDP areas 106, and each SDP area 106 include a set of the divisions. Compared with the staircase structures of conventional 3D memory devices using a single SDP mask, the bias of the distance between two adjacent SDP areas 106 can be reduced in staircase structures 102 of 3D memory device 100 by using multiple SDP masks as described below in detail. In some embodiments, the distance between two adjacent SDP areas 106 is about the same in the x-direction. Each SDP area 106 can extend in the x-direction, e.g., away from memory array structure 104, such that a number of stairs can be formed in the x-direction. In some embodiments, the number of stairs in the x-direction is equal to or greater than 64, such as 64, 96, 128, 160, 192, 224, 256, etc.

Figure 2A:
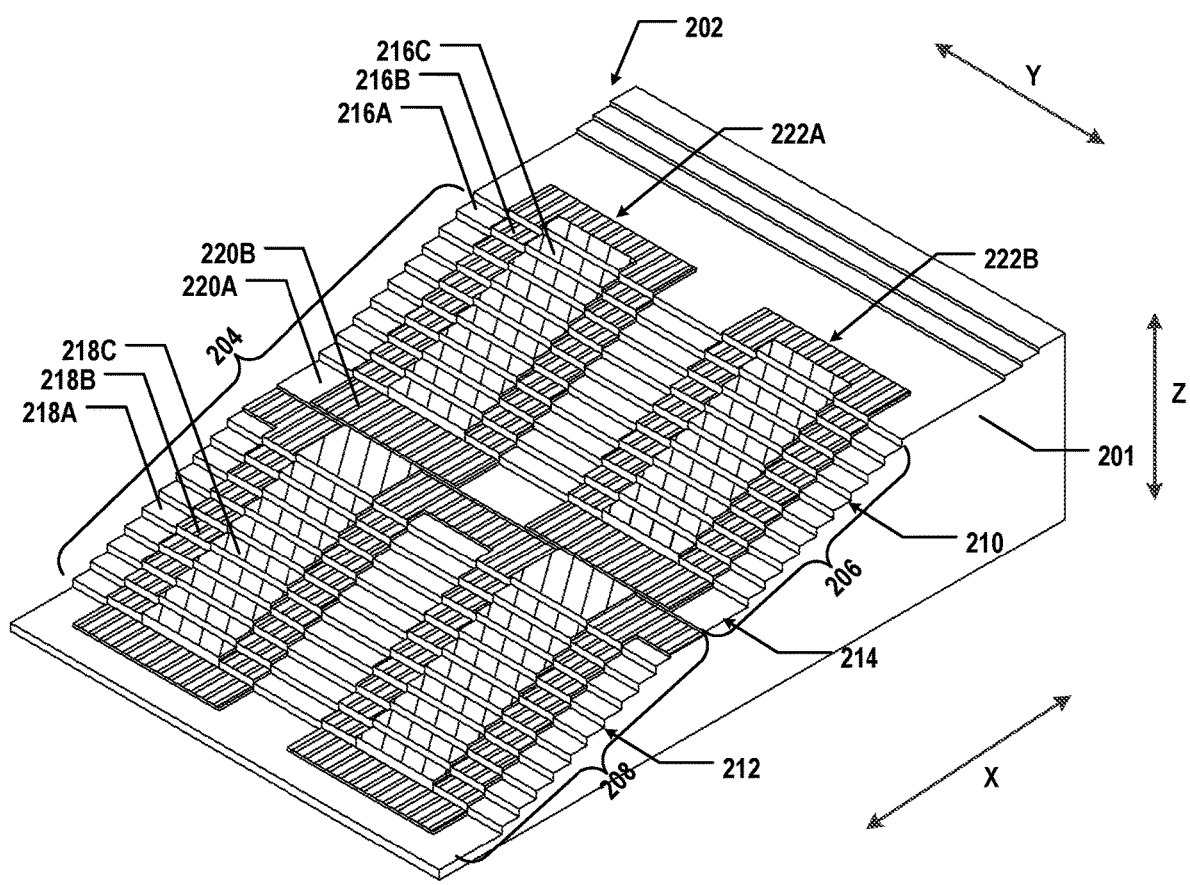
FIG. 2A illustrates a top front perspective view of an exemplary staircase structure of a 3D memory device, according to some embodiments of the present disclosure.

FIG. 2A illustrates a top front perspective view of an exemplary staircase structure 200 of a 3D memory device, according to some embodiments of the present disclosure. Staircase structure 200 can include a stack structure 201 on a substrate (not shown), which can include silicon (e.g., single crystalline silicon), silicon germanium (SiGe), gallium arsenide (GaAs), germanium (Ge), silicon on insulator (SOI), or any other suitable materials. Stack structure 201 can include interleaved first material layers and second material layers that are different from the first material layers. The first material layers and second material layers can alternate in the vertical direction. In some embodiments, stack structure 201 can include a plurality of material layer pairs stacked vertically in the z-direction, each of which includes a first material layer and a second material layer. The number of the material layer pairs in stack structure 201 (e.g., 32, 64, 96, or 128) can determine the number of memory cells in the 3D memory device.

In some embodiments, stack structure 201 is a stacked storage structure through which NAND memory strings are formed. Each of the first material layers includes a conductor layer, and each of the second material layers includes a dielectric layer. In some embodiments, each conductor layer can function as a gate line in the memory array structure and a word line ending at staircase structure 200 for word line fan-out. The conductor layers can include conductive materials including, but not limited to, tungsten (W), cobalt (Co), copper (Cu), aluminum (Al), polycrystalline silicon (polysilicon), doped silicon, silicides, or any combination thereof. The dielectric layers can include dielectric materials including, but not limited to, silicon oxide, silicon nitride, silicon oxynitride, or any combination thereof. In some embodiments, the conductor layers include metals, such as tungsten, and the dielectric layers include silicon oxide.

It is noted that x, y and z axes are included in FIG. 2A to further illustrate the spatial relationship of the components in staircase structure 200. The substrate of the 3D memory device includes two lateral surfaces extending laterally in the x-y plane: a top surface on the front side of the wafer on which staircase structure 200 can be formed, and a bottom surface on the backside opposite to the front side of the wafer. The z axis is perpendicular to both the x and y axes. As used herein, whether one component (e.g., a layer or a device) is "on," "above," or "below" another component (e.g., a layer or a device) of the 3D memory device is determined relative to the substrate of the 3D memory device in the z-direction (the vertical direction perpendicular to the x-y plane) when the substrate is positioned in the lowest plane of the 3D memory device in the z-direction. The same notion for describing spatial relationship is applied throughout the present disclosure.

Stack structure 201 of staircase structure 200 can include a peripheral region 202 and a staircase region 204 that is farther away from the memory array structure (not shown) than peripheral region 202. In some embodiments, peripheral region 202 includes a number of stairs without any divisions. That is, for each stair in peripheral region 202, the depth in the z-direction is nominally the same along the y-direction. In some embodiments, at least some of the stairs in peripheral region 202 are used to form top select gates (TSGs). Staircase region 204 can be separated from the stairs in peripheral region 202 in the x-direction by a distance. In some embodiments, staircase region 204 includes two staircase regions 206 and 208 arranged in the x-direction for subsequently forming two sets of stairs 210 and 212 using two different SDP masks as described below in detail. It is understood that the number of regions in staircase region 204 is not limited to two as shown in FIG. 2A and can be larger than two in other embodiments.

Each stair (as shown as a "level") of staircase structure 200 can include one or more material layer pairs. In some embodiments, the top material layer of each stair is a conductor layer for interconnection in the vertical direction. In some embodiments, each two adjacent stairs of staircase structure 200 are offset by a nominally same distance in the z-direction and a nominally same distance in the x-direction. Each offset thus can form a "landing area" for interconnection with word line via contacts of the 3D memory device in the z-direction direction. As shown in FIG. 2A, a first set of stairs 210 are disposed in first staircase region 206, a second set of stairs 212 are disposed in second staircase region 208, and an intermediate stair 214 is disposed between first and second sets of stairs 210 and 212 in the x-direction. By forming first and second sets of stairs 210 and 212 and intermediate stair 214, staircase structure 200 tilts downward (in the z-direction) and away from the memory array structure of the 3D memory device from first set of stairs 210 to second set of stairs 212 (in the x-direction). In some embodiments, the total number of first and second sets of stairs 210 and 212 is equal to or greater than 64, such as 64, 96, 128, 160, 192, 224, 256, etc.

As shown in FIG. 2A, staircase structure 200 can be a three-division staircase structure in which each stair of first and second sets of stairs 210 and 212 includes three divisions at different depths in the y-direction. In some embodiments, each stair in first set of stairs 210 includes three divisions 216A, 216B, and 216C at different depths in the y-direction, and each stair in second set of stairs 212 includes three divisions 218A, 218B, and 218C at different depths in the y-direction as well. That is, first and second sets of stairs 210 and 212 include the number of divisions for each stair. Intermediate stair 214 can include two divisions 220A and 220B. That is, intermediate stair 214 has fewer divisions than first and second sets of stairs 210 and 212 for each stair, according to some embodiments. As described below in detail, the formation of intermediate stair 214 with fewer divisions may depend on how the two SDP masks forming first and second sets of stairs 210 and 212, respectively, are aligned in the x-direction (e.g., whether first and second staircase regions 206 and 208 are separated, abutted, or overlapped in the x-direction). In some embodiments, as second staircase region 208 abuts first staircase region 206 in the x-direction and the edges of the two SDP masks are touched, intermediate stair 214 between first and second sets of stairs 210 and 212 has a smaller number of divisions than that of first and second sets of stairs 210 and 212.

As shown in FIG. 2A, staircase structure 200 can include two SDP areas 222A and 222B separated from one another in the y-direction. Each SDP area 222A or 222B includes multiple divisions of stairs, e.g., 216A-216C of first set of stairs 210, 218A-218C of second set of stairs 212, and 220A and 220B of intermediate stair 214, according to some embodiments. In some embodiments, SDP areas 222A and 222B have nominally the same dimensions in x-, y-, and/or z-directions. In some embodiments, by fabricating the multi-division stairs of staircase structure 200 in two separate steps in two staircase regions 206 and 208 using two SDP masks, the bias of the distance between two SDP areas 222A and 222B in the y-direction can be reduced compared with some known 3D memory devices as described above. In some embodiments, the distance between two SDP areas 222A and 222B is about the same in the x-direction. For example, the distance between two SDP areas 222A and 222B at the top stair in first set of stairs 210 may be about the same as that at the bottom stair in first set of stairs 210. Similarly, the distance between two SDP areas 222A and 222B at the top stair in second set of stairs 212 may be about the same as that at the bottom stair in second set of stairs 212. The distance between two SDP areas 222A and 222B at the top stair in first set of stairs 210 may be about the same as that at the bottom stair in second set of stairs 212 as well.

Figure 2B:
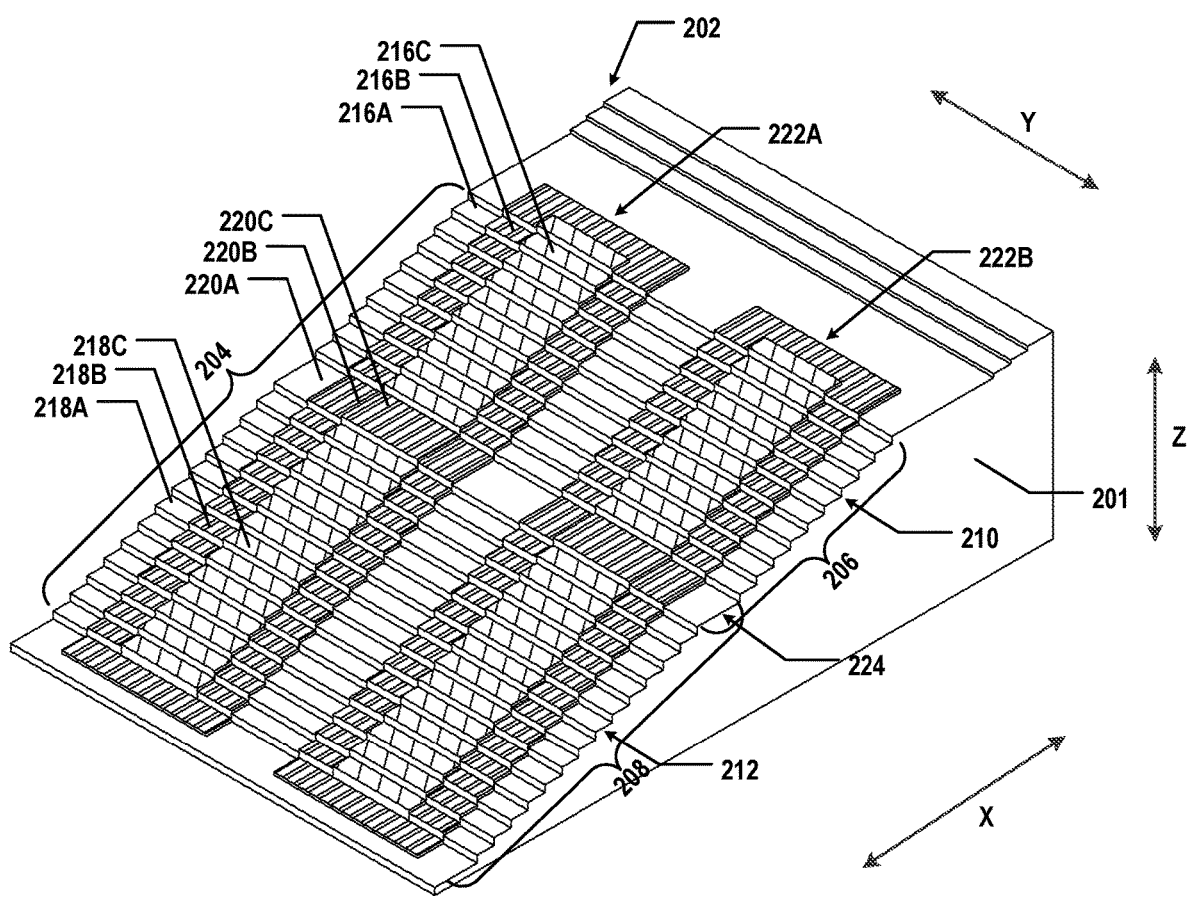
FIG. 2B illustrates a top front perspective view of another exemplary staircase structure of a 3D memory device, according to some embodiments of the present disclosure.

It is understood that depending on how multiple SDP masks are aligned in the x-direction (e.g., whether adjacent staircase regions are separated, abutted, or overlapped in the x-direction), one or more intermediate stairs can have the same number of divisions as that of other stairs in staircase region 204. FIG. 2B illustrates a top front perspective view of another exemplary staircase structure 230 of a 3D memory device, according to some embodiments of the present disclosure. Similar to staircase structure 200 described above in FIG. 2A, staircase structure 230 represents an example of a multi-division staircase structure having two staircase regions 206 and 208 arranged in the x-direction for subsequently forming two sets of stairs 210 and 212 using two different SDP masks. Different from staircase structure 200 described above in FIG. 2A in which second staircase region 208 abuts first staircase region 206, second staircase region 208 overlaps first staircase region 206 in the x-direction in FIG. 2B. As a result, an intermediate stair 224 between first and second sets of stairs 210 and 212 includes three divisions 220A, 220B, and 220C, the same number of divisions as that of first and second sets of stairs 210 and 212. In some embodiments, the dimension of intermediate stair 224 in the x-direction is greater than that of each stair of first and second sets of stairs 210 and 212. It is understood that the details of similar structures (e.g., materials, fabrication process, functions, etc.) in both staircase structures 200 and 230 may not be repeated below.

Figure 3A:
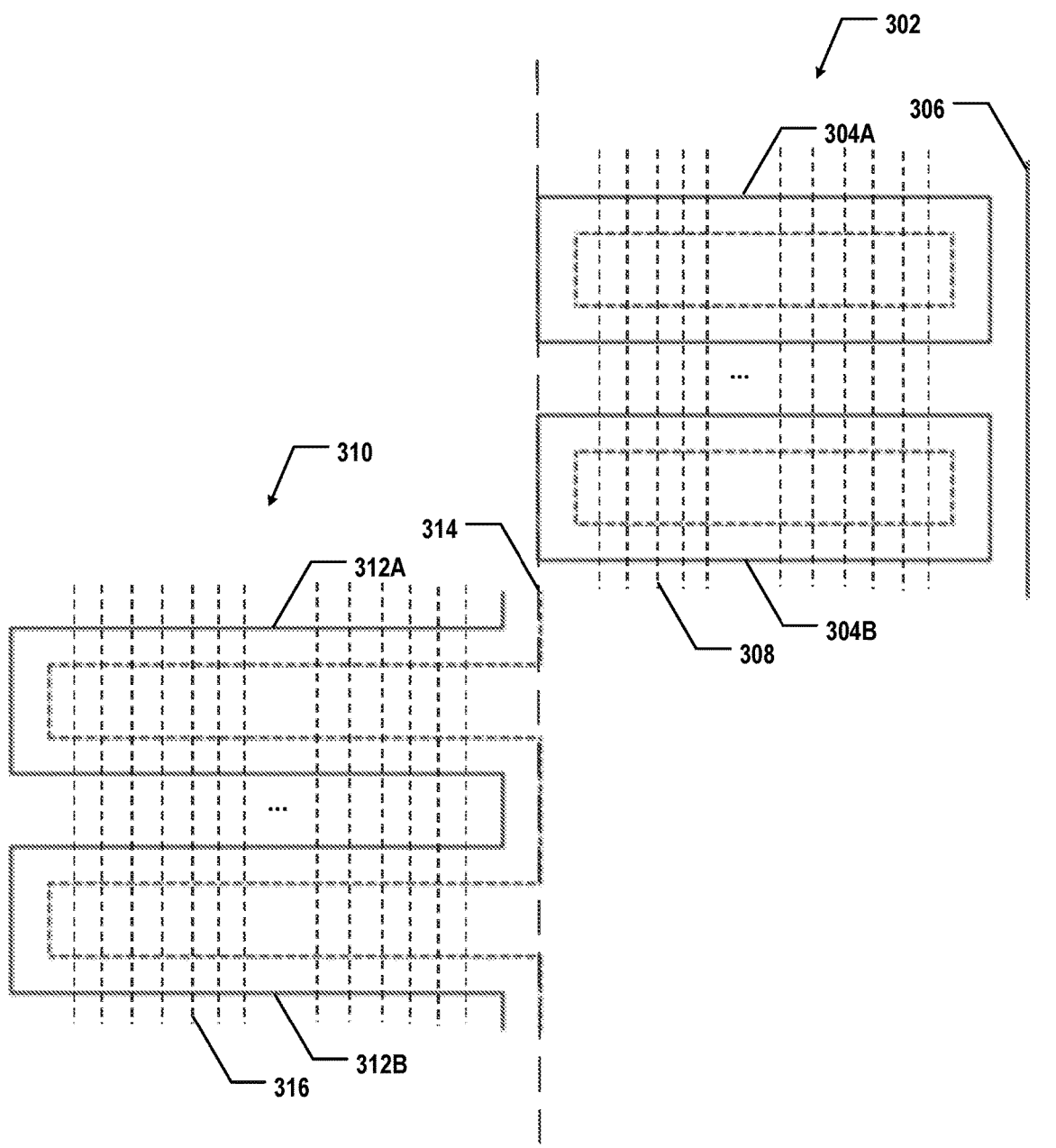
FIG. 3A illustrates an exemplary staircase dividing scheme (SDS) having two staircase dividing pattern (SDP) masks each having three divisions, according to some embodiments of the present disclosure.
Figure 3B:
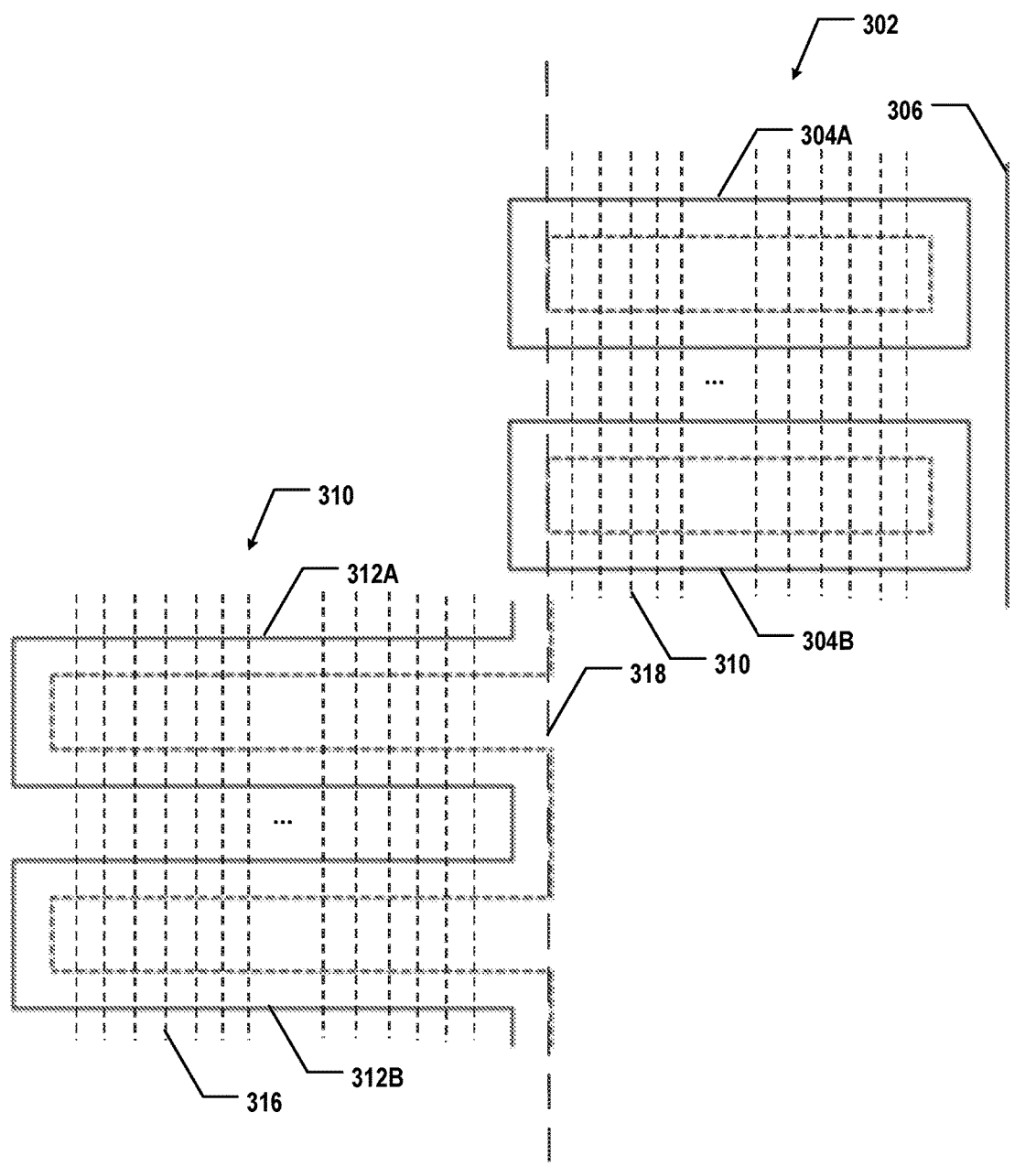
FIG. 3B illustrates another exemplary SDS having two SDP masks each having three divisions, according to some embodiments of the present disclosure.
Figure 7:
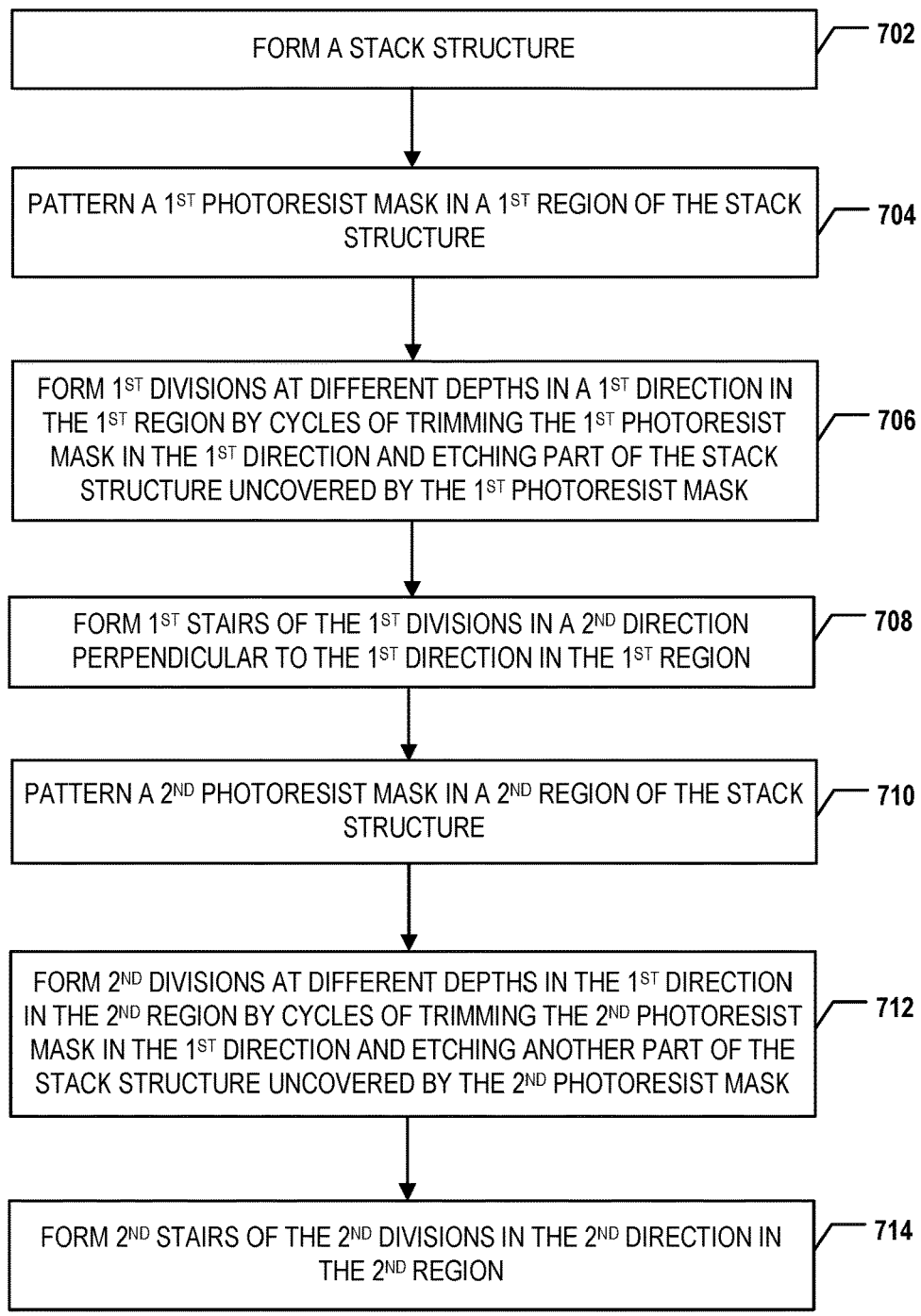
FIG. 7 is a flowchart of a method for forming an exemplary staircase structure of a 3D memory device, according to some embodiments.

FIG. 3A illustrates an exemplary staircase dividing scheme (SDS) having two SDP masks each having three divisions, according to some embodiments of the present disclosure. FIG. 3B illustrates another exemplary SDS having two SDP masks each having three divisions, according to some embodiments of the present disclosure. FIGS. 4A-4F illustrate a fabrication process for forming exemplary three-division staircase structures of a 3D memory device, according to various embodiments of the present disclosure. FIG. 7 is a flowchart of a method 700 for forming an exemplary staircase structure of a 3D memory device, according to some embodiments. Examples of the staircase structures depicted in FIGS. 4A-4F include staircase structures 200 and 230 depicted in FIGS. 2A-2B. FIGS. 3A-3B, 4A-4F, and 7 will be described together. It is understood that the operations shown in method 700 are not exhaustive and that other operations can be performed as well before, after, or between any of the illustrated operations. Further, some of the operations may be performed simultaneously, or in a different order than shown in FIG. 7.

Referring to FIG. 7, method 700 starts at operation 702, in which a stack structure including interleaved first material layers and second material layers is formed. In some embodiments, the stack structure is a dielectric stack, and each of the first material layers includes a first dielectric layer (also known as a "sacrificial layer"), and each of the second material layers includes a second dielectric layer different from the first dielectric layer. Interleaved first dielectric layers and second dielectric layers can be alternatingly deposited above a substrate.

Figure 4A:
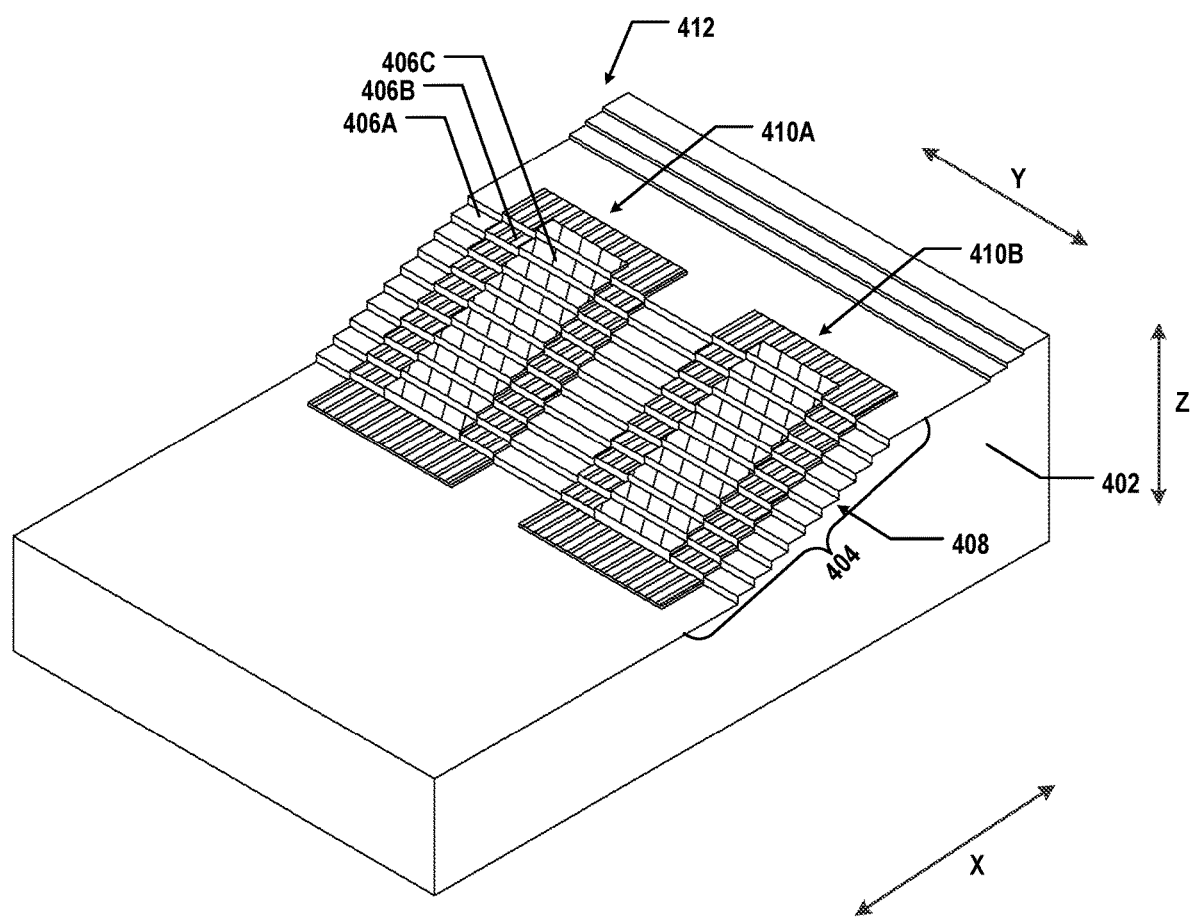
FIGS. 4A-4F illustrate a fabrication process for forming exemplary three-division staircase structures of a 3D memory device, according to various embodiments of the present disclosure.

Referring to FIG. 4A, a stack structure 402 including a plurality pairs of a first dielectric layer (also known as a "sacrificial layer") and a second dielectric layer (together referred to herein as "dielectric layer pairs") is formed above a silicon substrate (not shown). That is, stack structure 402 includes interleaved sacrificial layers and dielectric layers, according to some embodiments. The dielectric layers and sacrificial layers can be alternatingly deposited on the silicon substrate to form stack structure 402. In some embodiments, each dielectric layer includes a layer of silicon oxide, and each sacrificial layer includes a layer of silicon nitride. Stack structure 402 can be formed by one or more thin film deposition processes including, but not limited to, chemical vapor deposition (CVD), physical vapor deposition (PVD), atomic layer deposition (ALD), or any combination thereof.

In some embodiments, the stack structure is a memory stack, and each of the first material layers includes a conductor layer, and each of the second material layers includes a dielectric layer. Interleaved conductor layers and dielectric layers can be formed by a gate replacement process, which replaces the sacrificial layers in the dielectric stack with the conductor layers. That is, the staircase structure can be formed either prior to or after the gate replacement process on a dielectric stack or on a memory stack.

Referring to FIG. 4A, stack structure 402 can include a plurality pairs of a conductor layer and a dielectric layer (together referred to herein as "conductor/dielectric layer pairs"). That is, stack structure 402 includes interleaved conductor layers and dielectric layers, according to some embodiments. In some embodiments, each dielectric layer includes a layer of silicon oxide, and each conductor layer includes a layer of metal, such as tungsten, or a layer of semiconductor, such as polysilicon. In some embodiments, to form the memory stack of stack structure 402, a slit opening (not shown) can be formed through stack structure 402, the sacrificial layers in the dielectric stack can be etched by applying etchants through the slit opening to form a plurality of lateral recesses, and the conductor layers can be deposited in the lateral recesses using one or more thin film deposition processes including, but not limited to, CVD, PVD, ALD, or any combination thereof.

To form a staircase structure of a 3D memory device, a first plurality of stairs of the staircase structure, each of which includes a number of divisions at different depths, can be first formed based on a first photoresist mask. Method 700 proceeds to operation 704, as illustrated in FIG. 7, in which a first photoresist mask is patterned in a first region of the stack structure. The first photoresist mask includes a plurality of first patterns separated from one another in the first direction.

As illustrated in FIG. 3A, a first SDP mask 302 can be a photoresist mask or a lithography mask for forming the first photoresist mask. First SDP mask 302 includes two patterns 304A and 304B separated from one another in the y-direction, according to some embodiments. Each pattern 304A or 304B can have a nominally rectangular shape. First SDP mask 302 can also include a peripheral pattern 306 separated from patterns 304A and 304B in the x-direction. The solid lines in FIG. 3A illustrate the boundaries of photoresist layers covering the underneath stack structure.

As illustrated in FIG. 4A, a first photoresist mask having the same patterns as first SDP mask 302 is patterned in a first staircase region 404 of stack structure 402. First staircase region 404 can be only part, for example, about one-half, of the top surface of stack structure 402. It is understood that first staircase region 404 can occupy any arbitrary fraction of the top surface of stack structure 402. Each pattern 304A or 304B can correspond to a respective one of SDP areas 410A and 410B. The solid lines of pattern 304A or 304B correspond to the outer boundaries of division 406B in respective one of SDP areas 410A and 410B. In some embodiments, the first photoresist mask is formed by coating a photoresist layer on the top surface of stack structure 402 using spin coating and patterning the coated photoresist layer based on first SDP mask 302 using photolithography and development. The patterned first photoresist mask can be used as an etch mask to etch the exposed portions of stack structure 402.

Method 700 proceeds to operation 706, as illustrated in FIG. 7, in which a first plurality of divisions are formed at different depths in the first direction in the first region of the stack structure by a plurality cycles of trimming the first photoresist mask in the first direction and etching a part of the stack structure uncovered by the first photoresist mask. To form the first plurality of divisions, the part of the stack structure uncovered by the first photoresist mask can be etched by a stair depth. The first photoresist mask can be trimmed to enlarge the part of the stack structure uncovered by the first photoresist mask. The enlarged part of the stack structure uncovered by the trimmed first photoresist mask can be etched by the stair depth. The cycle of trimming and etching is repeated for a number of times based on the number of the first plurality of divisions. In some embodiments, the first photoresist mask is trimmed in both the first direction and second direction perpendicular to the first direction.

As illustrated in FIG. 3A, first SDP mask 302 having patterns 304A and 304B and peripheral pattern 306 (represented by the solid lines) can be used as a first etch mask. As illustrated in FIG. 4A, part of stack structure 402 uncovered by the first etch mask (corresponding to division 406A) is etched by the stair depth using wet etching and/or dry etching processes. Any suitable etchants (e.g., of wet etching and/or dry etching) can be used to remove a certain thickness (e.g., the stair depth) of stack structure 402 in the exposed portions. A peripheral region 412 of stack structure 402 uncovered by peripheral pattern 306 can be etched by the stair depth as well. The etched thickness (e.g., the stair depth) can be controlled by etch rate and/or etch time. In some embodiments, the stair depth is nominally the same as the thickness of a material layer pair (e.g., a dielectric layer pair or a conductor/dielectric layer pair). It is understood that in some embodiments, the stair depth is multiple times of the thickness of a material layer pair.

As illustrated in FIG. 3A, first SDP mask 302 can be trimmed (e.g., etched incrementally and inwardly). The dashed lines of patterns 304A and 304B and peripheral pattern 306 illustrate the boundaries of the trimmed photoresist layers covering the underneath stack structure. Each of patterns 304A and 304B can be trimmed in both the x-direction and y-direction due to its rectangular shape. Peripheral pattern 306 can be trimmed only in the x-direction because it extends the entire dimension of stack structure 402 in the y-direction. First SDP mask 302 having trimmed patterns 304A and 304B and trimmed peripheral pattern 306 (represented by the dashed lines) can be used as a second etch mask.

As illustrated in FIG. 4A, the amount of the trimmed photoresist layer in the first photoresist mask can be controlled by trim rate and/or trim time and can be directly relevant (e.g., determinant) to the dimensions of the resulting stairs. The trim of the first photoresist mask can be performed using any suitable etching process, e.g., isotropic dry etching or wet etching. The trim of the first photoresist mask can cause the part of stack structure 402 uncovered by the first photoresist mask be enlarged. The enlarged uncovered portions of stack structure 402 can be etched again using the trimmed first photoresist mask as the second etch mask to form three divisions 406A, 406B, and 406C at different depths in each SDP area 410A or 410B. Any suitable etchants (e.g., of wet etching and/or dry etching) can be used to remove a certain thickness (e.g., the stair depth)

of stack structure 402 in the enlarged exposed portions. Peripheral region 412 of stack structure 402 uncovered by trimmed peripheral pattern 306 can be etched again by the stair depth as well. The etched thickness (e.g., the stair depth) can be controlled by etch rate and/or etch time. In some embodiments, the etched thickness is nominally the same as the etched thickness in the previous etching step. As a result, the depth offset between adjacent divisions 406A-406C is nominally the same. It is understood that in some embodiments, the etched thicknesses are different in different etching steps such that the depth offsets are different as well between adjacent divisions 406A-406C. The trim process of a photoresist mask followed by the etching process of a stack structure is referred to herein as a trim-etch cycle. The number of trim-etch cycles can determine the number of divisions formed in first staircase region 404. In some embodiments, three divisions 406A-406C in each SDP area 410A or 410B are formed by one trim-etch cycle following an etching process.

Method 700 proceeds to operation 708, as illustrated in FIG. 7, in which a plurality of first stairs of the first plurality of divisions are formed in the second direction perpendicular to the first direction in the first region of the stack structure. As illustrated in FIG. 3A, a plurality of trim-etch cycles 308 can be performed in the x-direction away from peripheral pattern 306 to form a first set of stairs of the first divisions.

As illustrated in FIG. 4A, a first set of stairs 408 of divisions 406A-406C are formed in the x-direction away from peripheral region 412 and the memory array structure (not shown). Each stair of first set of stairs 408 includes three divisions 406A-406C in two SDP areas 410A and 410B. First set of stairs 408 can be formed by a plurality of trim-etch cycles as described above in detail. The number of first set of stairs 408 can be determined by the number of trim-etch cycles. The dimensions of each stair of first set of stairs 408 can be determined by the amount of the trimmed photoresist layer (different from the first photoresist mask) in each cycle (e.g., determining the dimension in the x-direction) and by the etched thickness in each cycle (e.g., determining the depth in the z-direction). In some embodiments, the amount of trimmed photoresist layer in each cycle is nominally the same, so that the dimension of each stair of first set of stairs 408 in the x-direction is nominally the same. In some embodiments, the etched thickness in each cycle is nominally the same, so that the depth of each stair of first set of stairs 408 is nominally the same.

To form the staircase structure of the 3D memory device, after forming the first plurality of stairs, a second plurality of stairs of the staircase structure, each of which includes the number of divisions, can be formed based on a second photoresist mask. The staircase structure can tilt downward and away from a memory array structure of the 3D memory device from the first plurality of stairs to the second plurality of stairs. Method 700 proceeds to operation 710, as illustrated in FIG. 7, in which a second photoresist mask is patterned in a second region of the stack structure after forming the plurality of first stairs. In some embodiments, the first region of the stack structure is closer to the memory array structure of the 3D memory device than the second region of the stack structure. In one example, the second region of the stack structure is separated from the first region of the stack structure in the second direction. In another example, the second region of the stack structure abuts the first region of the stack structure in the second direction. In still another example, the second region of the stack structure overlaps the first region of the stack structure in the second direction. In some embodiments, the second photoresist mask includes a plurality of second patterns separated from one another in the first direction.

As illustrated in FIG. 3A, a second SDP mask 310 can be a photoresist mask or a lithography mask for forming the second photoresist mask. Second SDP mask 310 includes two patterns 312A and 312B separated from one another in the y-direction, according to some embodiments. Each pattern 312A or 312B can have a nominally rectangular shape with one side connected to another. The solid lines in FIG. 3A illustrate the boundaries of photoresist layers covering the underneath stack structure. When patterning the second photoresist mask using second SDP mask 310, patterns 312A and 312B of second SDP mask 310 can be aligned with patterns 304A and 304B of first SDP mask 302, respectively, in the y-direction.

Figure 4B:
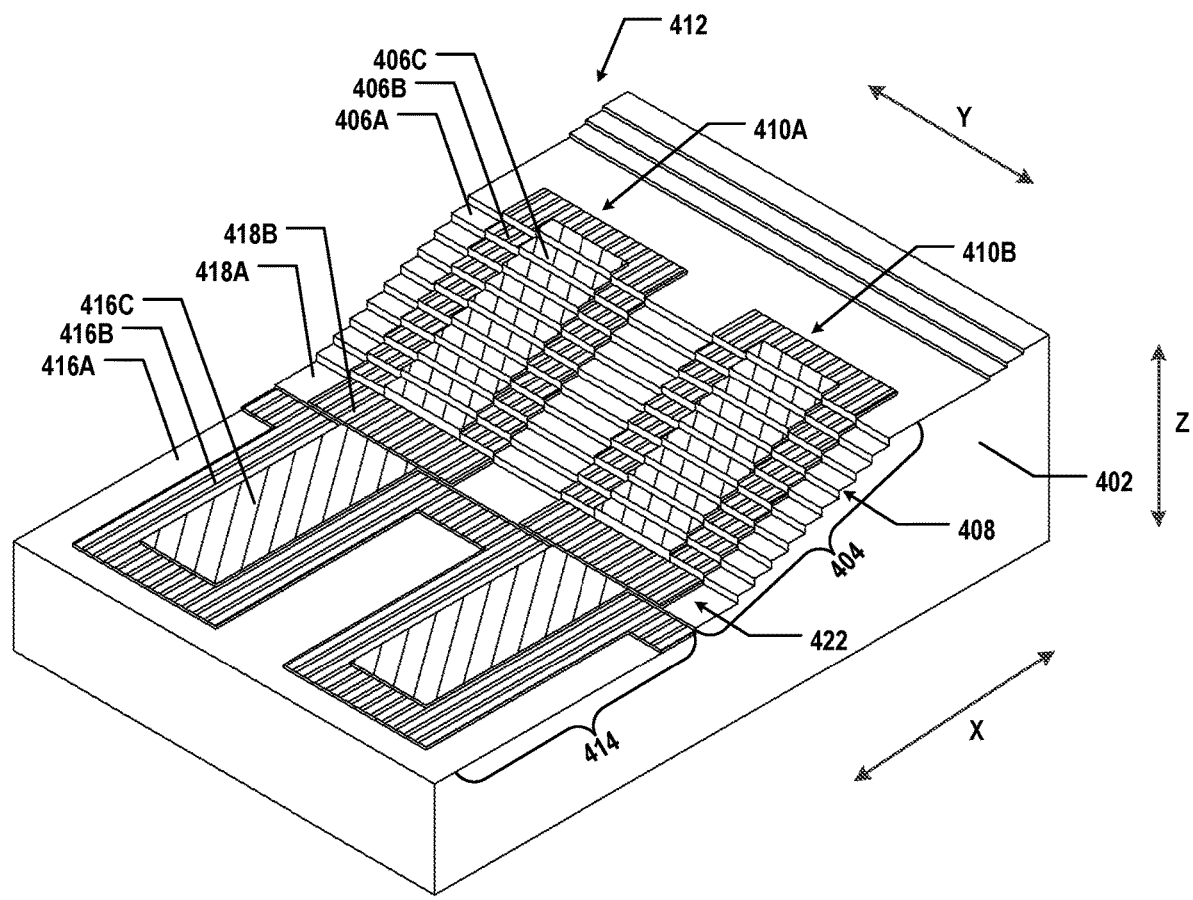

As illustrated in FIG. 4B, a second photoresist mask having the same patterns as second SDP mask 310 is patterned in a second staircase region 414 of stack structure 402. First staircase region 404 is closer to peripheral region 412 and the memory array structure (not shown) than second staircase region 414, according to some embodiments. Second staircase region 414 can be only part, for example, about one-half, of the top surface of stack structure 402. It is understood that second staircase region 414 can occupy any arbitrary fraction of the top surface of stack structure 402. As shown in FIG. 4B, second staircase region 414 abuts first staircase region 404 in the x-direction, according to some embodiments. Each pattern 312A or 312B can correspond to a respective one of SDP areas 410A and 410B. The solid lines of pattern 312A or 312B correspond to the outer boundaries of division 416B in respective one of SDP areas 410A and 410B. In some embodiments, the second photoresist mask is formed by coating a photoresist layer on the top surface of stack structure 402 using spin coating and patterning the coated photoresist layer based on second SDP mask 310 using photolithography and development. The patterned second photoresist mask can be used as an etch mask to etch the exposed portions of stack structure 402.

Method 700 proceeds to operation 712, as illustrated in FIG. 7, in which a second plurality of divisions are formed at different depths in the first direction in the second region of the stack structure by a plurality cycles of trimming the second photoresist mask in the first direction and etching another part of the stack structure uncovered by the second photoresist mask. To form the second plurality of divisions, the part of the stack structure uncovered by the second photoresist mask can be etched by the stair depth. The second photoresist mask can be trimmed to enlarge the part of the stack structure uncovered by the second photoresist mask. The enlarged part of the stack structure uncovered by the trimmed second photoresist mask can be etched by the stair depth. The cycle of trimming and etching is repeated for a number of times based on the number of the second plurality of divisions. In some embodiments, the second photoresist mask is trimmed in both the first direction and second direction perpendicular to the first direction. In some embodiments, the number of the second plurality of divisions is the same as the number of the first plurality of divisions.

As illustrated in FIG. 3A, second SDP mask 310 having patterns 312A and 312B (represented by the solid lines) can be used as a first etch mask. As illustrated in FIG. 4B, part of stack structure 402 uncovered by the first etch mask (corresponding to division 416A) is etched by the stair depth using wet etching and/or dry etching processes. In some embodiments, the etched thickness (e.g., the stair depth) is nominally the same as the thickness of a material layer pair (e.g., a dielectric layer pair or a conductor/dielectric layer pair). It is understood that in some embodiments, the stair depth is multiple times of the thickness of a material layer pair.

As illustrated in FIG. 3A, second SDP mask 310 can be trimmed (e.g., etched incrementally and inwardly). The dashed lines of patterns 312A and 312B illustrate the boundaries of the trimmed photoresist layers covering the underneath stack structure. Each of patterns 312A and 312B can be trimmed in both the x-direction and y-direction due to its rectangular shape. As shown in FIG. 3A, a boundary 314 of trimmed patterns 312A and 312B in the x-direction toward peripheral pattern 306 and the memory array structure (not shown) abuts first SDP mask 302, according to some embodiments. That is, second SDP mask 310 can be aligned to touch first SDP mask 302 in the x-direction. Second SDP mask 310 having trimmed patterns 312A and 312B (represented by the dashed lines) can be used as a second etch mask.

As illustrated in FIG. 4B, the amount of the trimmed photoresist layer in the second photoresist mask can be controlled by trim rate and/or trim time and can be directly relevant (e.g., determinant) to the dimensions of the resulting stairs. The trim of the second photoresist mask can be performed using any suitable etching process, e.g., isotropic dry etching or wet etching. The trim of the second photoresist mask can cause the part of stack structure 402 uncovered by the second photoresist mask be enlarged. The enlarged uncovered portions of stack structure 402 can be etched again using the trimmed second photoresist mask as the second etch mask to form three divisions 416A, 416B, and 416C at different depths in each SDP area 410A or 410B. As shown in FIGS. 3A and 4B, second staircase region 414 abuts first staircase region 404, and boundary 314 of second SDP mask 310 abuts first SDP mask 302 after trimming, according to some embodiments. As a result, an intermediate stair 422 is formed with fewer divisions (two divisions 418A and 418B) than divisions in first set of stairs 408 (three divisions 406A-406C).

In some embodiments, the etched thickness is nominally the same as the etched thickness in the previous etching step. As a result, the depth offset between adjacent divisions 416A-416C is nominally the same. It is understood that in some embodiments, the etched thicknesses are different in different etching steps such that the depth offsets are different as well between adjacent divisions 416A-416C. The number of trim-etch cycles can determine the number of divisions formed in second staircase region 414. In some embodiments, three divisions 416A-416C in each SDP area 410A or 410B are formed by one trim-etch cycle following an etching process. The number of divisions 416A-416C in second staircase region 414 can be the same as the number of divisions 406A-406C in first staircase region 404.

Method 700 proceeds to operation 714, as illustrated in FIG. 7, in which a plurality of second stairs of the second plurality of divisions are formed in the second direction in the second region of the stack structure. As illustrated in FIG. 3A, a plurality of trim-etch cycles 316 can be performed in the x-direction away from peripheral pattern 306 to form a second set of stairs of the second divisions.

Figure 4C:
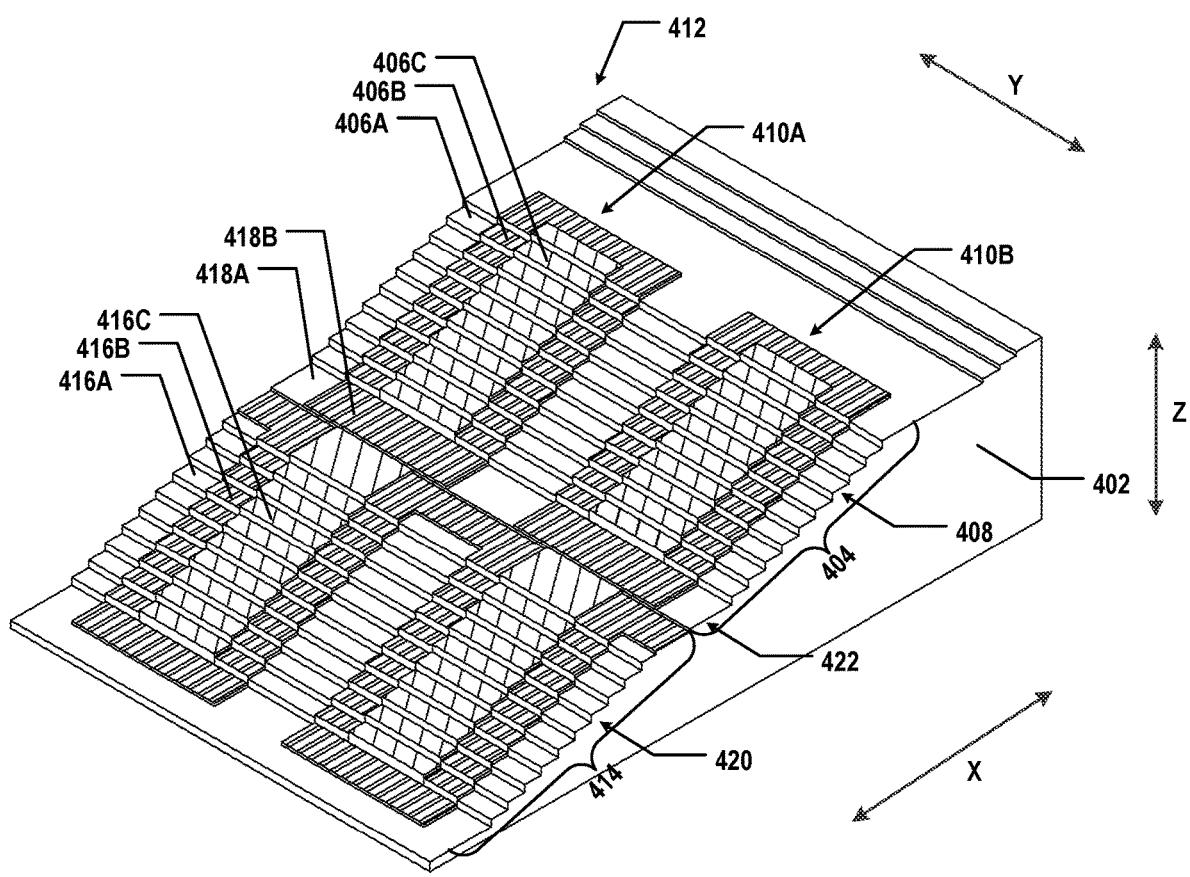

As illustrated in FIG. 4C, a second set of stairs 420 of divisions 416A-416C are formed in the x-direction away from peripheral region 412 and the memory array structure (not shown). Each stair of second set of stairs 420 includes three divisions 416A-416C in two SDP areas 410A and 410B. Second set of stairs 420 can be formed by a plurality of trim-etch cycles as described above in detail. The number of second set of stairs 420 can be determined by the number of trim-etch cycles. The dimensions of each stair of second set of stairs 420 can be determined by the amount of trimmed photoresist layer (different from the second photoresist mask) in each cycle (e.g., determining the dimension in the x-direction) and by the etched thickness in each cycle (e.g., determining the depth in the z-direction). In some embodiments, the amount of trimmed photoresist layer in each cycle is nominally the same, so that the dimension of each stair of second set of stairs 420 in the x-direction is nominally the same. In some embodiments, the etched thickness in each cycle is nominally the same, so that the depth of each stair of second set of stairs 420 is nominally the same.

As shown in FIG. 4C, a staircase structure is thereby formed, which tilts downward and away from peripheral region 412 and the memory array structure (not shown) of the 3D memory device from first set of stairs 408 to second set of stairs 420. Each stair of first set of stairs 408 and second set of stairs 420 includes the same number (3) of divisions. By subsequently forming two sets of stairs 408 and 420 using two SDP masks 302 and 310 as described above in detail, the bias of the distance between two SDP areas 410A and 410B in the y-direction can be reduced compared with some known 3D memory devices.

As shown in FIG. 4C, the staircase structure includes intermediate stair 422 between first and second sets of stairs 408 and 420 with fewer divisions (2) than first and second sets of stairs 408 and 420 (3) as second staircase region 414 abuts first staircase region 404. By changing the relative positions of first and second staircase regions 404 and 414 in the x-direction and the alignment of second SDP mask 310 with respect to first SDP mask 302, the profile of the intermediate stair can be changed as well. For example, as illustrated in FIG. 3B, a boundary of untrimmed patterns 312A and 312B of second SDP mask 310 (represented by the solid lines) in the x-direction toward peripheral pattern 306 abuts first SDP mask 302, and a boundary 318 of trimmed patterns 312A and 312B (represented by the dashed lines) in the x-direction toward peripheral pattern 306 overlaps first SDP mask 302, according to some embodiments. That is, second SDP mask 310 can be aligned to overlap first SDP mask 302 in the x-direction after trimming.

Figure 4D:
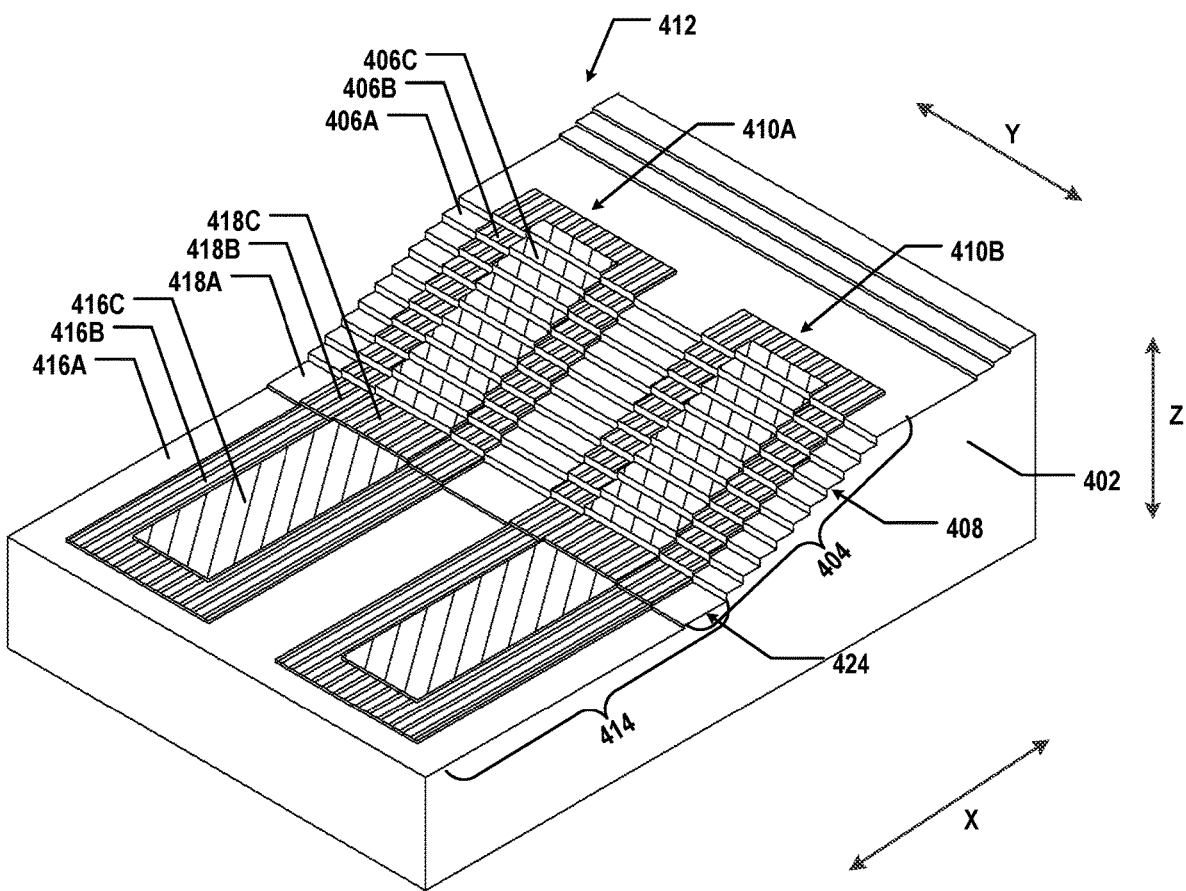
Figure 4E:
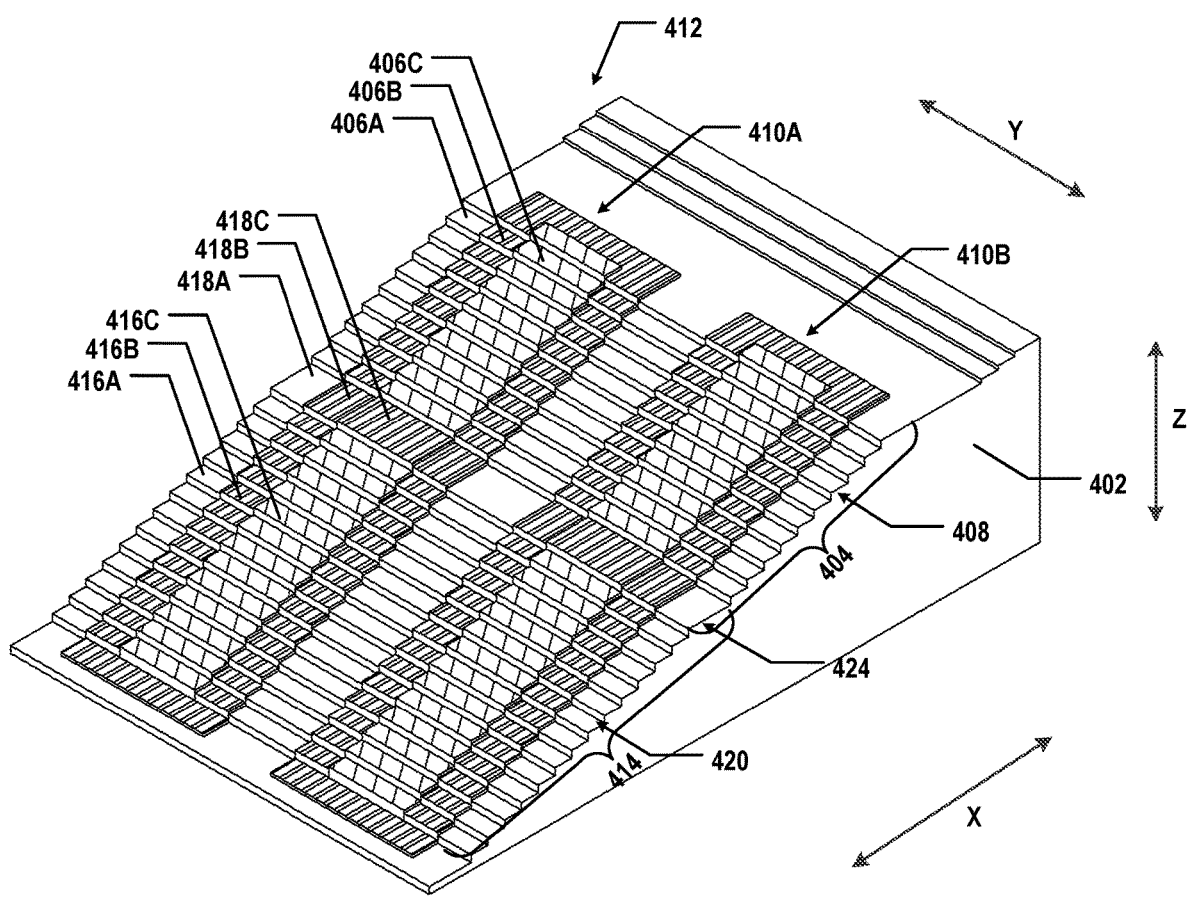

As illustrated in FIG. 4D, second SDP mask 310 shown in FIG. 3B can be used to pattern the second photoresist mask in second staircase region 414. After one trim-etch cycle following an etching process, three divisions 416A, 416B, and 416C can be formed in second staircase region 414. Different from the example in FIG. 4B in which second staircase region 414 abuts first staircase region 404, in FIG. 4D, second staircase region 414 overlaps first staircase region 404 because of the way in which first and second SDP masks 302 and 310 are aligned in the x-direction as shown in FIG. 3B. As a result, different from the example of FIG. 4B in which intermediate stair 422 includes two divisions 418A and 418B, in FIG. 4D, an intermediate stair 424 includes three divisions 418A, 418B, and 418C after one trim-etch cycle following an etching process. As illustrated in FIG. 4E, similar to the example of FIG. 4C, second set of stairs 420 of divisions 416A-416C can be formed by a plurality of trim-etch cycles. The number (3) of divisions is the same for each of first and second sets of stairs 408 and 420 and intermediate stair 424, according to some embodiments.

Figure 4F:
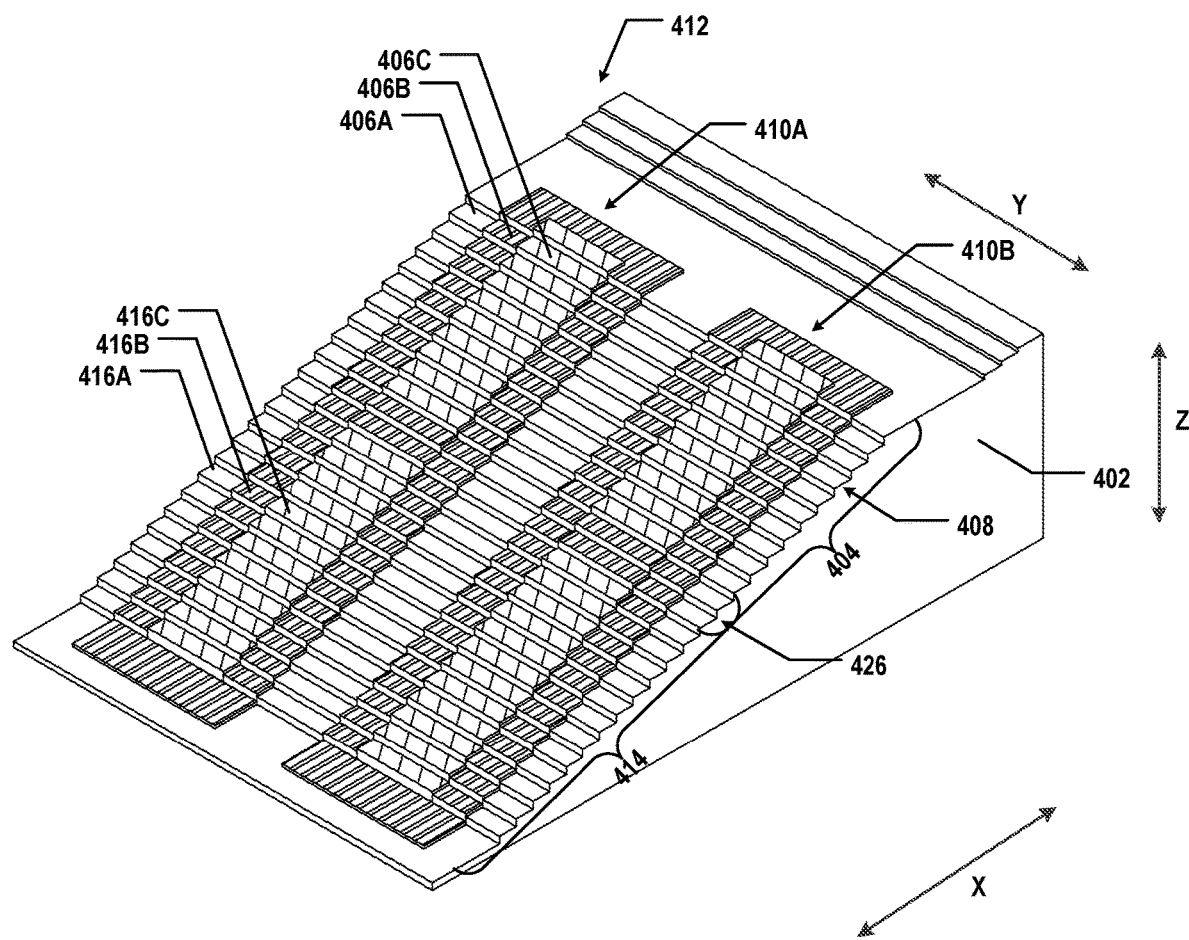

In some embodiments, by further overlapping first and second SDP masks 302 and 310 (e.g., moving second SDP mask 310 further toward first SDP mask 302), the profile of the intermediate stair(s) can be further changed. For example, as illustrated in FIG. 4F, second staircase region 414 can be overlapped with first staircase region 404 to a greater extent compared with the example of FIG. 4D, such that two intermediate stairs 426 can be formed. Each intermediate stair 426 can have a smaller dimension in the x-direction than that of intermediate stair 424 in FIG. 4E. It is further understood that in some embodiments, second staircase region 414 is separated from first staircase region 404, and second SDP mask 310 is separated from first SDP mask 302 before and after trimming. The profile of the intermediate stair(s) can be changed accordingly.

Although FIGS. 2A-2B, 3A-3B, and 4A-4F illustrate examples of three-division staircase structures that include three divisions at different depths in each SDP area, it is understood that the multi-division staircase structures and fabrication methods thereof are not limited to three-division. For example, FIGS. 5A-5B illustrate exemplary SDS having two SDP masks each having four divisions, and FIGS. 6A-6E illustrate a fabrication process for forming exemplary four-division staircase structures of a 3D memory device, according to various embodiments of the present disclosure.

Figure 5A:
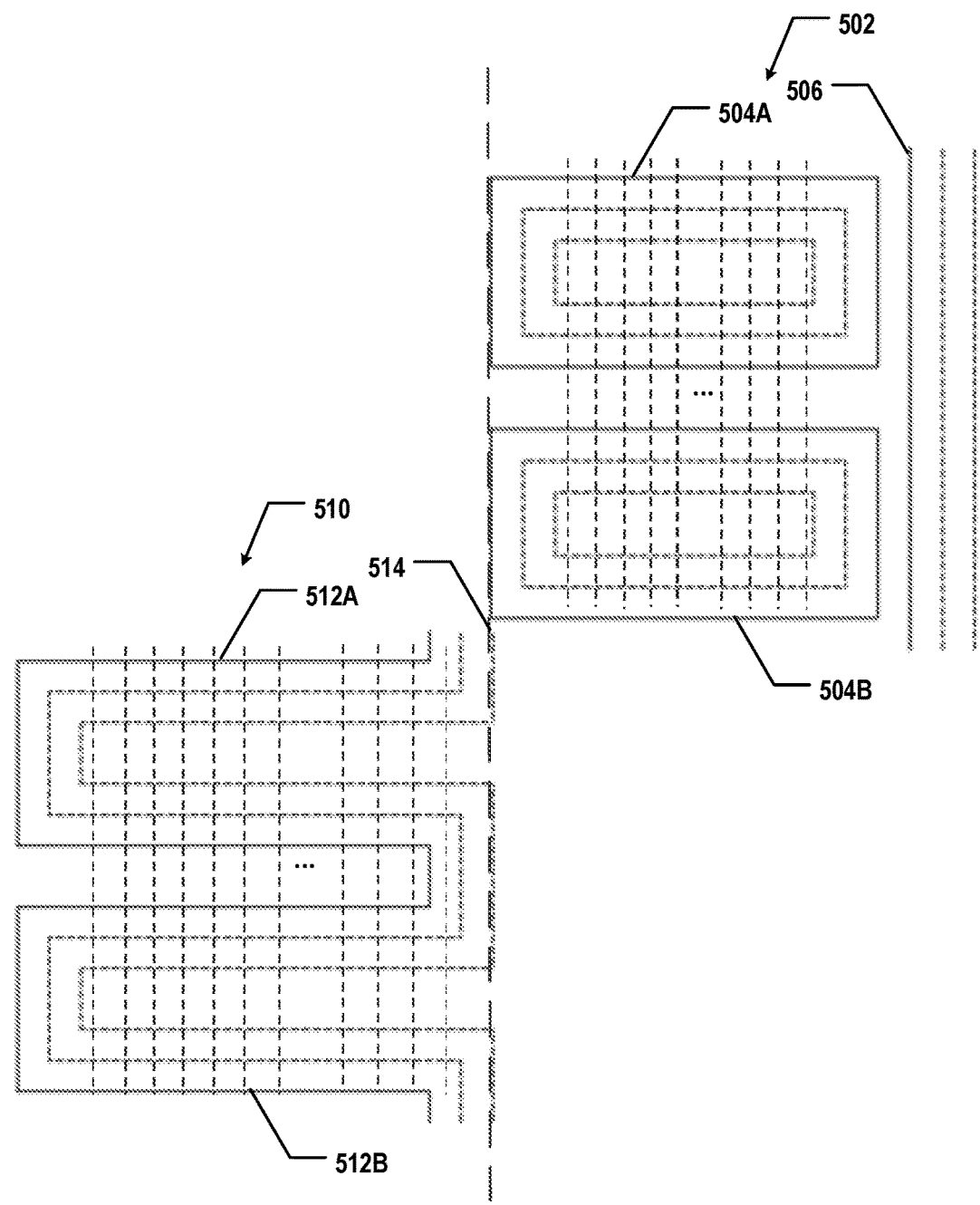
FIG. 5A illustrates an exemplary SDS having two SDP masks each having four divisions, according to some embodiments of the present disclosure.

As illustrated in FIG. 5A, similar to the example of FIG. 3A, a first SDP mask 502 includes two patterns 504A and 504B separated from one another in the y-direction and a peripheral pattern 506, and a second SDP mask 510 includes two patterns 512A and 512B separated from one another in the y-direction. Instead of performing one trim-etch cycle as shown in FIG. 3A, two trim-etch cycles can be performed based on first and second SDP masks 502 and 510 to form trimmed patterns 504A, 504B, 512A, and 512B and trimmed peripheral pattern 506 (represented by the dashed lines). As shown in FIG. 5A, after two trim-etch cycles, a boundary 514 of trimmed patterns 512A and 512B of second SDP mask 510 in the x-direction toward peripheral pattern 506 abuts patterns 504A and 504B of first SDP mask 502, according to some embodiments.

Figure 6A:
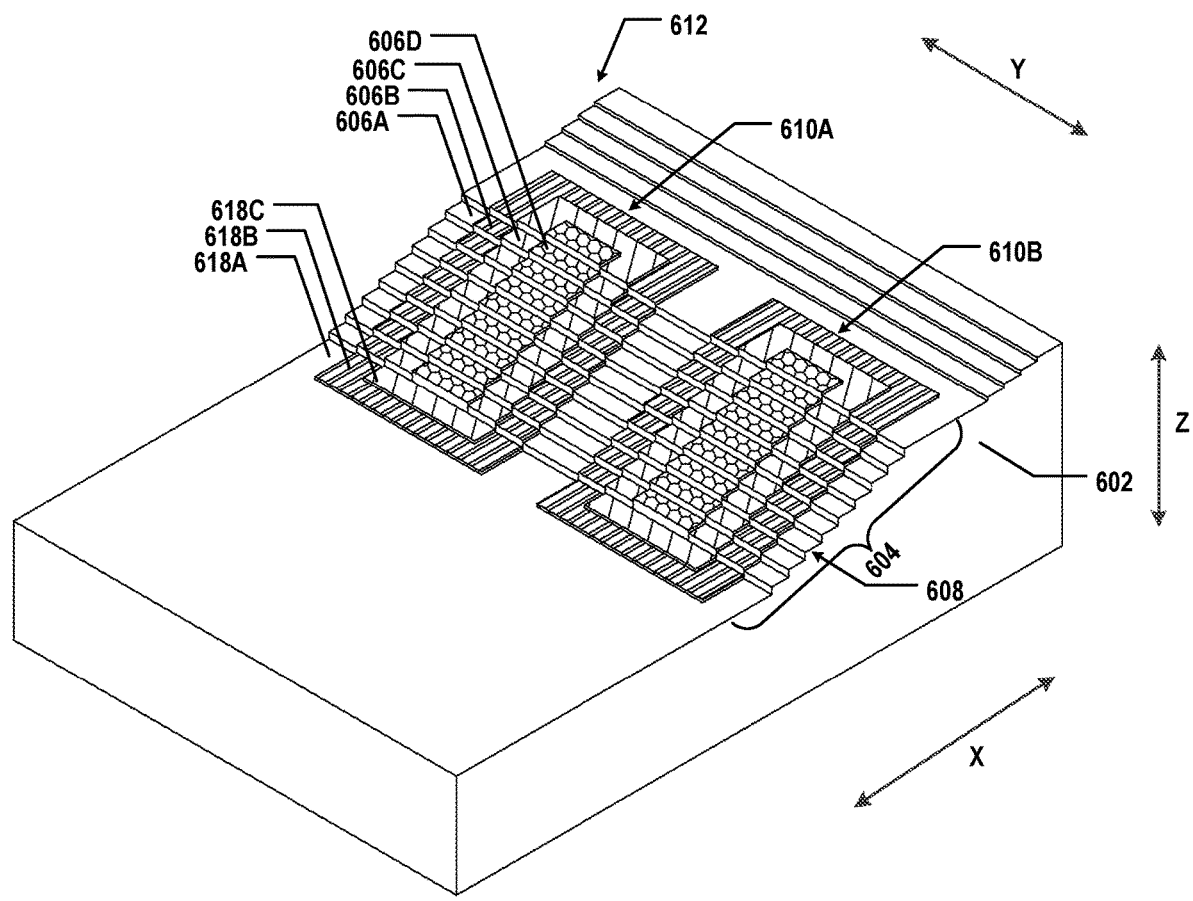
FIGS. 6A-6E illustrate a fabrication process for forming exemplary four-division staircase structures of a 3D memory device, according to various embodiments of the present disclosure.
Figure 6B:
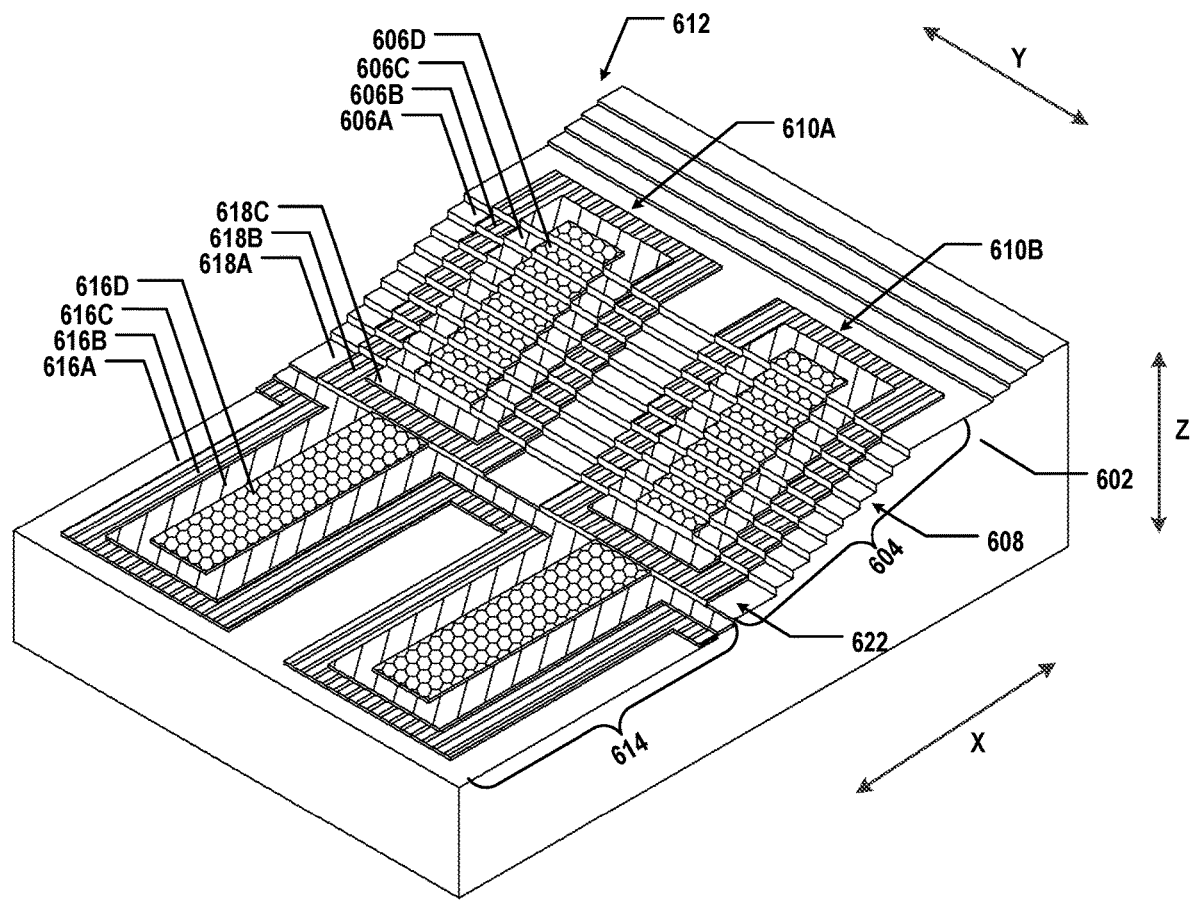
Figure 6C:
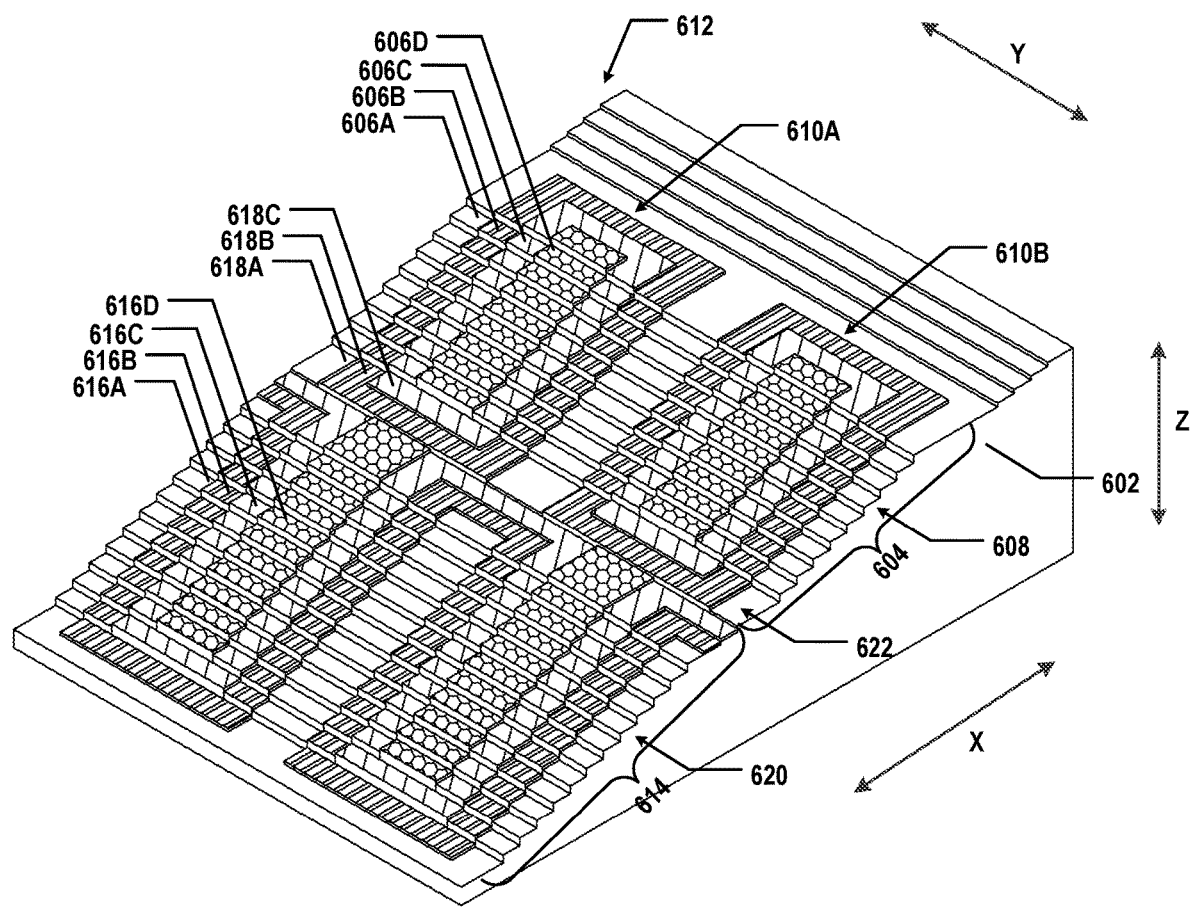

As illustrated in FIGS. 6A-6C, which are similar to FIGS. 4A-4C, first and second SDP masks 502 and 510 are used to pattern a first photoresist mask and a second photoresist mask in a first staircase region 604 and a second staircase region 614, respectively, of a stack structure 602. First staircase region 604 abuts second staircase region 614, according to some embodiments. In first staircase region 604, four divisions 606A, 606B, 606C, and 606D can be formed at different depths in each of first and second SDP areas 610A and 610B by two cycles of trimming the first photoresist mask in the y-direction and etching a part of stack structure 602 uncovered by the first photoresist mask. Four stairs in peripheral region 612 are formed as well by the two trim-etch cycles, according to some embodiments. A first set of stairs 608 of four divisions 606A-606D then can be formed in the x-direction in first staircase region 604 by multiple trim-etch cycles. After the formation of first set of stairs 608 having four divisions 606A-606D, in second staircase region 614, four divisions 616A, 616B, 616C, and 616D can be formed at different depths in each of first and second SDP areas 610A and 610B by two cycles of trimming the second photoresist mask in the y-direction and etching another part of stack structure 602 uncovered by the second photoresist mask. A second set of stairs 620 of four divisions 616A-616D then can be formed in the x-direction in second staircase region 614 by multiple trim-etch cycles. As second staircase region 614 abuts first staircase region 604, an intermediate stair 622 between first and second sets of stairs 608 and 620 in the x-direction can be formed with a smaller number (3) of divisions 618A, 618C, and 618C than the number (4) of divisions in each of first and second sets of stairs 608 and 620.

Figure 5B:
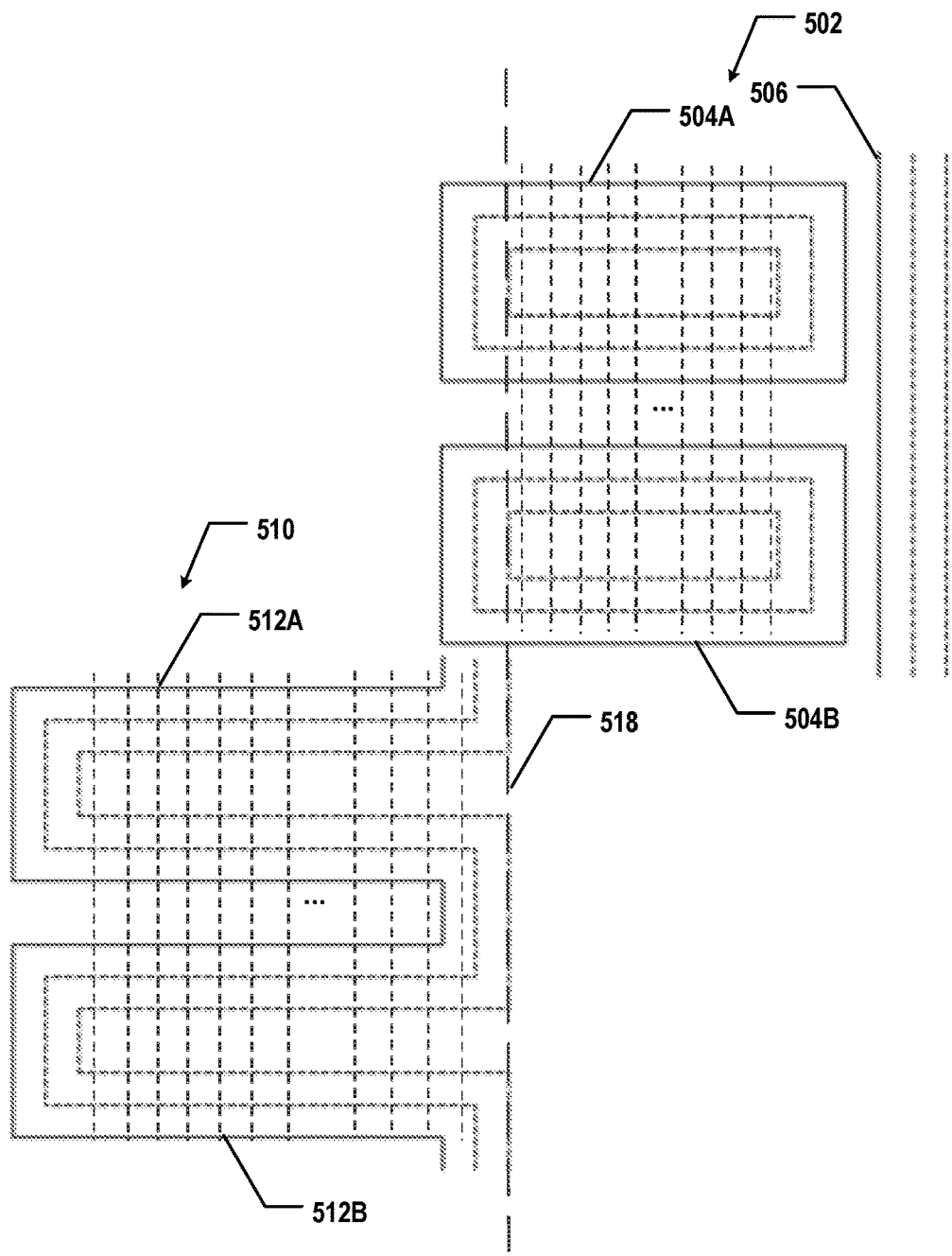
FIG. 5B illustrates another exemplary SDS having two SDP masks each having four divisions, according to some embodiments of the present disclosure.
Figure 6D:
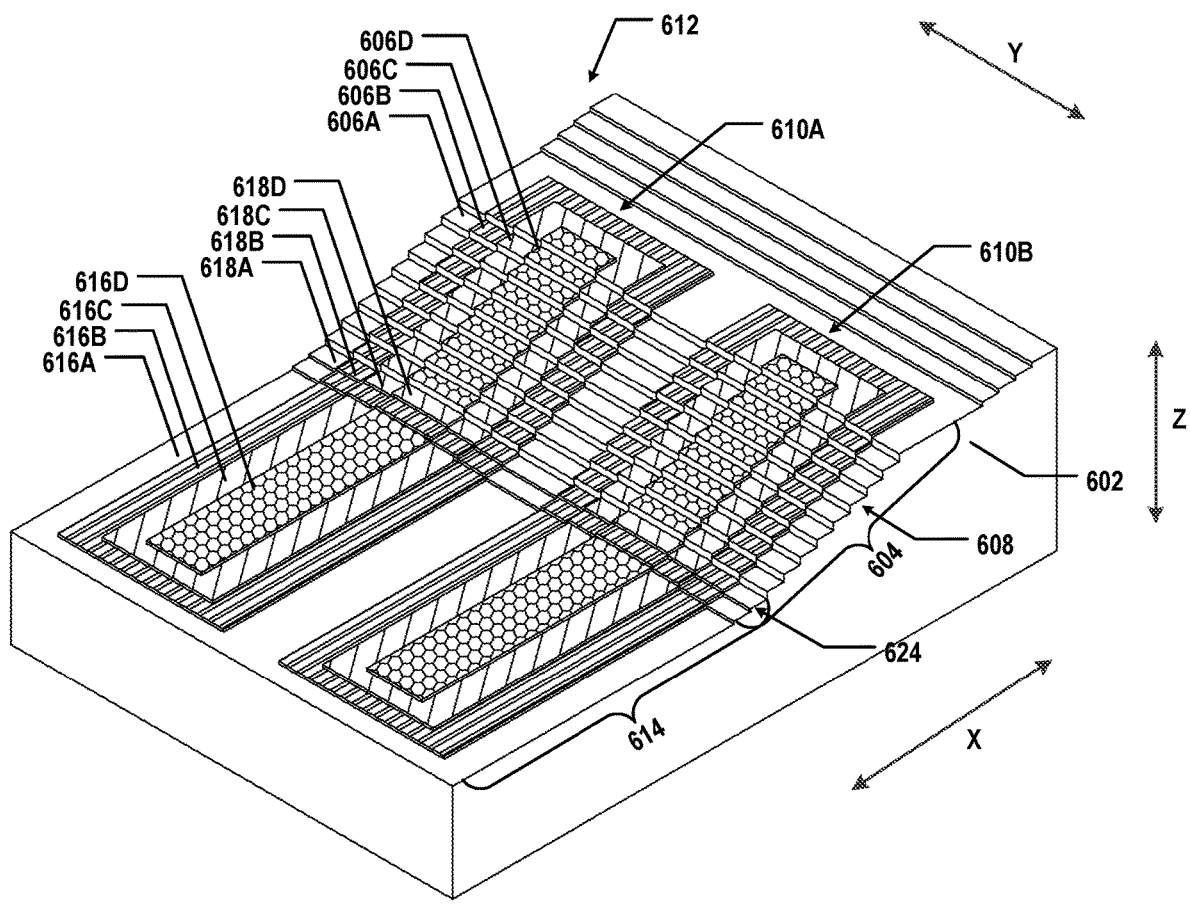
Figure 6E:
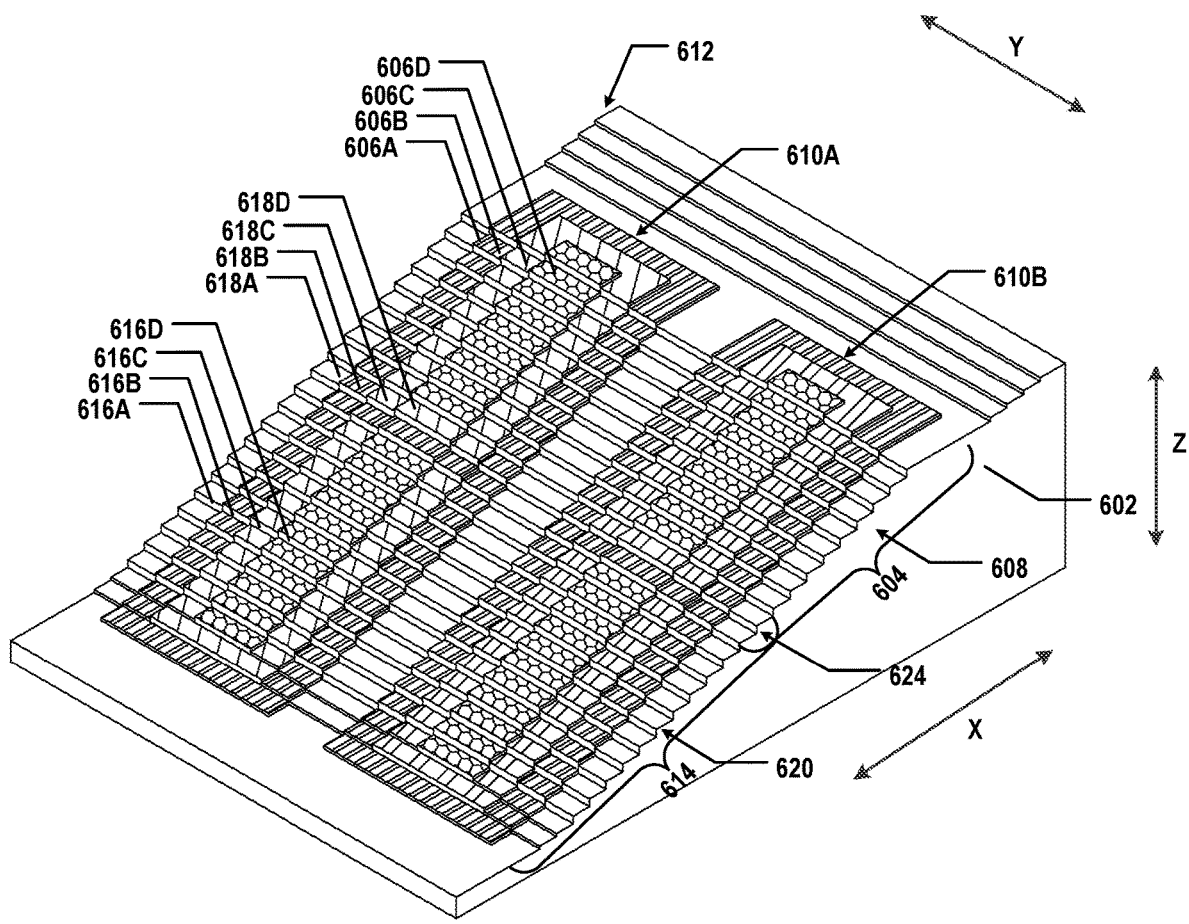

In some embodiments as illustrated in FIG. 5B, first and second SDP masks 502 and 510 can be overlapped, for example, by moving second SDP mask 510 further toward first SDP mask 502. As shown in FIG. 5B, a boundary of untrimmed patterns 512A and 512B of second SDP mask 510 in the x-direction toward peripheral pattern 506 abuts first SDP mask 502, and a boundary 518 of trimmed patterns 512A and 512B of second SDP mask 510 (after two trim-etch cycles) overlaps first SDP mask 502, according to some embodiments. As a result, the profile of the intermediate stair(s) can be further changed. For example, as illustrated in FIG. 6D, second staircase region 614 can be overlapped with first staircase region 604, such that two intermediate stairs 624 can be formed, each of which includes four divisions 618A, 618B, 618C, and 618D after two trim-etch cycles following an etching process. As illustrated in FIG. 6E, the staircase structure can be formed having first and second sets of stairs 608 and 620 and intermediate stairs 624, each of which includes four divisions in each of first and second SDP areas 610A and 610B.

According to one aspect of the present disclosure, a method for forming a staircase structure of a 3D memory device is disclosed. A stack structure including interleaved first material layers and second material layers is formed. A first photoresist mask is patterned in a first region of the stack structure. A first plurality of divisions are formed at different depths in a first direction in the first region of the stack structure by a plurality cycles of trimming the first photoresist mask in the first direction and etching a part of the stack structure uncovered by the first photoresist mask. A plurality of first stairs of the first plurality of divisions are formed in a second direction perpendicular to the first direction in the first region of the stack structure. A second photoresist mask is patterned in a second region of the stack structure after forming the plurality of first stairs. A second plurality of divisions are formed at different depths in the first direction in the second region of the stack structure by a plurality cycles of trimming the second photoresist mask in the first direction and etching another part of the stack structure uncovered by the second photoresist mask. A plurality of second stairs of the second plurality of divisions are formed in the second direction in the second region of the stack structure.

In some embodiments, the first photoresist mask includes a plurality of first patterns separated from one another in the first direction.

In some embodiments, to form the first plurality of divisions, the part of the stack structure uncovered by the first photoresist mask is etched by a stair depth, the first photoresist mask is trimmed to enlarge the part of the stack structure uncovered by the first photoresist mask, the enlarged part of the stack structure uncovered by the trimmed first photoresist mask is etched by the stair depth, and the cycle of trimming and etching is repeated for a number of times based on a number of the first plurality of divisions. In some embodiments, the first photoresist mask is trimmed in both the first and second directions.

In some embodiments, the first region of the stack structure is closer to a memory array structure of the 3D memory device than the second region of the stack structure.

In some embodiments, the second region of the stack structure is separated from the first region of the stack structure in the second direction. In some embodiments, the second region of the stack structure abuts the first region of the stack structure in the second direction. In some embodiments, the second region of the stack structure overlaps the first region of the stack structure in the second direction.

In some embodiments, the second photoresist mask includes a plurality of second patterns separated from one another in the first direction.

In some embodiments, to form the second plurality of divisions, the part of the stack structure uncovered by the second photoresist mask is etched by the stair depth, the second photoresist mask is trimmed to enlarge the part of the stack structure uncovered by the second photoresist mask, the enlarged part of the stack structure uncovered by the trimmed second photoresist mask is etched by the stair depth, and the cycle of trimming and etching is repeated for a number of times based on a number of the second plurality of divisions. In some embodiments, the second photoresist mask is trimmed in both the first and second directions. In some embodiments, the number of the second plurality of divisions is the same as the number of the first plurality of divisions.

In some embodiments, each of the first material layers includes a conductor layer, and each of the second material layers includes a dielectric layer. In some embodiments, each of the first material layers includes a first dielectric layer, and each of the second material layers includes a second dielectric layer different from the first dielectric layer.

According to another aspect of the present disclosure, a method for forming a staircase structure of a 3D memory device is disclosed. A first plurality of stairs of the staircase structure are formed based on a first photoresist mask. Each of the first plurality of stairs includes a number of divisions at different depths. After forming the first plurality of stairs, a second plurality of stairs of the staircase structure are formed based on a second photoresist mask. Each of the second plurality of stairs includes the number of divisions. The staircase structure tilts downward and away from a memory array structure of the 3D memory device from the first plurality of stairs to the second plurality of stairs.

In some embodiments, to form the first plurality of stairs, the first photoresist mask is patterned in a first region of a stack structure comprising interleaved first material layers and second material layers, the divisions are formed at different depths in a first direction in the first region of the stack structure by a plurality cycles of trimming the first photoresist mask in the first direction and etching a part of the stack structure uncovered by the first photoresist mask, and the plurality of first stairs are formed in a second direction perpendicular to the first direction in the first region of the stack structure.

In some embodiments, to form the second plurality of stairs, the second photoresist mask is patterned in a second region of the stack structure, the divisions are formed at different depths in the first direction in the second region of the stack structure by a plurality cycles of trimming the second photoresist mask in the first direction and etching another part of the stack structure uncovered by the second photoresist mask, and the plurality of second stairs are formed in the second direction in the second region of the stack structure.

In some embodiments, to form the divisions, the part of the stack structure uncovered by the first or second photoresist mask is etched by a stair depth, the first or second photoresist mask is trimmed to enlarge the part of the stack structure uncovered by the first or second photoresist mask, the enlarged part of the stack structure uncovered by the trimmed first or second photoresist mask is etched by the stair depth, and the cycle of trimming and etching is repeated for a number of times based on the number of the divisions. In some embodiments, the first or second photoresist mask is trimmed in both the first and second directions.

In some embodiments, the second region of the stack structure is separated from the first region of the stack structure in the second direction. In some embodiments, the second region of the stack structure abuts the first region of the stack structure in the second direction. In some embodiments, the second region of the stack structure overlaps the first region of the stack structure in the second direction.

In some embodiments, each of the first material layers includes a conductor layer, and each of the second material layers includes a dielectric layer. In some embodiments, each of the first material layers includes a first dielectric layer, and each of the second material layers includes a second dielectric layer different from the first dielectric layer.

According to still another aspect of the present disclosure, a 3D memory device includes a memory array structure and a staircase structure. The staircase structure includes a first plurality of stairs, a second plurality of stairs, and at least one intermediate stair. Each of the first plurality of stairs includes a first number of divisions at different depths in a first direction. The second plurality of stairs are farther away from the memory array structure than the first plurality of stairs in a second direction perpendicular to the first direction. Each of the second plurality of stairs includes the first number of the divisions. The at least one intermediate stair is between the first plurality of stairs and the second plurality of stairs in the second direction. Each of the at least one intermediate stair includes a second number of divisions in the first direction that is fewer than the first number.

In some embodiments, the first number is 3, and the second number is 2. In some embodiments, the first number is 4, and the second number is 2 or 3.

In some embodiments, the divisions of the first and second plurality of stairs are disposed in a plurality of areas separated from one another in the first direction.

In some embodiments, a distance between adjacent two of the plurality of areas is about the same in the second direction.

In some embodiments, a total number of the first and second plurality of stairs is equal to or greater than 64.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a memory array structure; and
a staircase structure, comprising:
   a first plurality of stairs, wherein each of the first plurality of stairs comprises a first number of divisions at different depths in a first direction;
   a second plurality of stairs farther away from the memory array structure than the first plurality of stairs in a second direction perpendicular to the first direction, wherein each of the second plurality of stairs comprises the first number of the divisions; and
   at least one intermediate stair between the first plurality of stairs and the second plurality of stairs in the second direction, wherein the intermediate stair comprises a second number of divisions in the first direction that is fewer than the first number, wherein the second number is an integer larger than 1.

2. The 3D memory device of claim 1, wherein the first number of divisions is 3, and the second number of divisions is 2.

3. The 3D memory device of claim 1, wherein the first number of divisions is 4, and the second number of divisions is 2 or 3.

4. The 3D memory device of claim 1, wherein the divisions of the first and second plurality of stairs are disposed in a plurality of areas separated from one another in the first direction.

5. The 3D memory device of claim 4, wherein a distance between adjacent two of the plurality of areas is about the same in the second direction.

6. The 3D memory device of claim 1, wherein a total number of the first and second plurality of stairs is equal to or greater than 64.

7. The 3D memory device of claim 1, wherein the memory array structure comprises an array of NAND memory strings.

8. The 3D memory device of claim 1, wherein the staircase structure further comprises a third plurality of stairs without any divisions, the first plurality of stairs being farther away from the memory array structure than the third plurality of stairs in the second direction.

9. A three-dimensional (3D) memory device, comprising:
a memory array structure; and
a staircase structure, comprising:
   a first plurality of stairs, wherein each of the first plurality of stairs comprises a number of divisions at different depths in a first direction, the number being an integer larger than 1;
   a second plurality of stairs farther away from the memory array structure than the first plurality of stairs in a second direction perpendicular to the first direction, wherein each of the second plurality of stairs comprises the same number of the divisions; and
   at least one intermediate stair between the first plurality of stairs and the second plurality of stairs in the second direction,
   wherein the intermediate stair comprises the same number of the divisions, and a dimension of the at least one intermediate stair is greater than a dimension of each of the first and second pluralities of stairs in the second direction, a dimension of each stair of the first plurality of stairs in the second direction is nominally the same, and a dimension of each stair of the second plurality of stairs in the second direction is nominally the same.

10. The 3D memory device of claim 9, wherein the number of divisions is 3.

11. The 3D memory device of claim 9, wherein the divisions of the first and second plurality of stairs are disposed in a plurality of areas separated from one another in the first direction.

12. The 3D memory device of claim 11, wherein a distance between adjacent two of the plurality of areas is about the same in the second direction.

13. The 3D memory device of claim 9, wherein a total number of the first and second plurality of stairs is equal to or greater than 64.

14. The 3D memory device of claim 9, wherein the memory array structure comprises an array of NAND memory strings.

15. The 3D memory device of claim 9, wherein the staircase structure further comprises a third plurality of stairs without any divisions, the first plurality of stairs being farther away from the memory array structure than the third plurality of stairs in the second direction.

* * * * *